(12) United States Patent
Saito et al.

(10) Patent No.: US 9,374,074 B2
(45) Date of Patent: Jun. 21, 2016

(54) VOLTAGE SELECTION CIRCUIT AND SEMICONDUCTOR INTEGRATED CIRCUIT DEVICE HAVING THE SAME

(71) Applicant: ALPS ELECTRIC CO., LTD., Tokyo (JP)

(72) Inventors: Junichi Saito, Miyagi-ken (JP); Akira Asao, Miyagi-ken (JP); Tomoyuki Sawataishi, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 14/634,464

(22) Filed: Feb. 27, 2015

(65) Prior Publication Data

US 2015/0256166 A1 Sep. 10, 2015

(30) Foreign Application Priority Data

Mar. 6, 2014 (JP) ................................. 2014-043952

(51) Int. Cl.
*H03K 5/1532* (2006.01)

(52) U.S. Cl.
CPC .................................. *H03K 5/1532* (2013.01)

(58) Field of Classification Search
None
See application file for complete search history.

(56) References Cited

U.S. PATENT DOCUMENTS

| | | | |
|---|---|---|---|
| 8,022,574 B2 * | 9/2011 | Ryoo | H02J 1/10 307/80 |
| 9,130,553 B2 * | 9/2015 | Huisman | H03K 5/2472 |
| 2008/0024192 A1 * | 1/2008 | Kase | H03K 17/005 327/407 |
| 2010/0103576 A1 | 4/2010 | Sugimoto et al. | |
| 2012/0025890 A1 * | 2/2012 | Doorenbos | H03K 5/08 327/318 |

FOREIGN PATENT DOCUMENTS

JP 05-152526 6/1993

* cited by examiner

*Primary Examiner* — Long Nguyen
(74) *Attorney, Agent, or Firm* — Beyer Law Group LLP

(57) ABSTRACT

The highest voltage of a power supply voltage, a ground potential, and a signal voltage is output as a selection voltage from a terminal on the output side. In this case, terminals on the input side and the terminal on the output side are connected to each other through MOS transistors in the ON state. Therefore, it is possible to suppress a voltage drop due to a parasitic diode of each MOS transistor.

11 Claims, 23 Drawing Sheets

FIG. 9

| VDD [V] | VSIG [V] | VSS [V] | Q4 | Q7 | Q5, Q6 | Q1 | Q2 | Q3 |
|---|---|---|---|---|---|---|---|---|
| 4 | 2 | 0 | 0 | 1 | 0 | 1 | 0 | 0 |
| 4 | 0 | 2 | 0 | 0 | 0 | 1 | 0 | 0 |
| 2 | 4 | 0 | 0 | 1 | 1 | 0 | 0 | 1 |
| 0 | 4 | 2 | 1 | 1 | 1 | 0 | 0 | 1 |
| 0 | 2 | 4 | 1 | 0 | 0 | 0 | 1 | 0 |
| 2 | 0 | 4 | 1 | 0 | 0 | 0 | 1 | 0 |

VOLTAGE SELECTION CIRCUIT AND SEMICONDUCTOR INTEGRATED CIRCUIT DEVICE HAVING THE SAME

CLAIM OF PRIORITY

This application claims benefit of Japanese Patent Application No. 2014-043952 filed on Mar. 6, 2014, which is hereby incorporated by reference.

BACKGROUND OF THE INVENTION

1. Field of the Invention

The present invention relates to a voltage selection circuit that selects one voltage from a plurality of voltages, and in particular, to a voltage selection circuit integrated in a semiconductor integrated circuit device.

2. Description of the Related Art

A semiconductor integrated circuit device, such as a CMOS, has a problem in that an excessive current flows to the inside through a parasitic diode of a transistor or the like when a reverse-polarity voltage is applied to power supply terminals (+terminal, −terminal) due to incorrect connection or the like. Japanese Unexamined Patent Application Publication No. 05-152526 discloses a protection circuit for preventing such reverse connection of a power supply.

In the protection circuit for preventing the reverse connection of a power supply disclosed in Japanese Unexamined Patent Application Publication No. 05-152526, protection against reverse connection is performed only for two lines of power supply terminals (+terminal, −terminal). However, for example, many semiconductor integrated circuit devices having a sensing function include not only power supply terminals but also terminals for signal input and output. In this case, since there is a possibility of incorrect connection among three lines of the power supply terminals (+terminal, −terminal) and the signal terminals, protection against the incorrect connection is not sufficient just by using the circuit disclosed in Japanese Unexamined Patent Application Publication No. 05-152526.

FIG. 23 is a diagram showing an example of a semiconductor integrated circuit device having a function of protecting an internal circuit against incorrect connection among three lines of power supply terminals VDD and VSS and an output terminal VOUT. The semiconductor integrated circuit device shown in FIG. 23 includes a circuit 100 having a function of a power switch for turning on or off the connection between the power supply terminal VDD and the output terminal OUT according to the detection result of a sensor or the like and a circuit 101 formed by three diodes having respective cathodes connected in common.

The circuit 101 is a circuit for supplying the highest voltage of the power supply voltage VDD, the ground potential VSS, and the output voltage VOUT to the circuit 100 as a power supply voltage. The configuration of the circuit 101 is the same as a rectifier circuit that has been used in a power supply device. Regardless of the relative magnitude relationship among the power supply voltage VDD and the ground potential VSS input from the outside and the output voltage VOUT, the highest voltage of these is always supplied to a power supply line on the high voltage side of the circuit 100. Accordingly, the power supply line is never lower than the ground potential VSS. In addition, since a P-type MOS transistor 111 having a bulk to which the highest voltage is applied is connected to the output terminal VOUT, no current flows to the bulk from the output terminal VOUT through a parasitic diode of the P-type MOS transistor 111. Therefore, according to the semiconductor integrated circuit device shown in FIG. 23, no excessive current flows to the internal circuit even if there is incorrect connection among the three lines of the power supply terminals VDD and VSS and the output terminal VOUT. Although the circuit 100 having a power switch function has been mentioned as an example in FIG. 23, the same protection as described above can also be realized for a circuit having a power regulator function or a signal input and output function.

However, since the circuit 101 shown in FIG. 23 is formed by diodes, a voltage drop in the forward direction inevitably occurs. This voltage drop is approximately 0.6 V in the case of a PN junction diode, and changes depending on the passing current or temperature. In recent years, the power supply voltage has become increasingly lower according to a reduction in the processing size in the semiconductor manufacturing process. If the power supply voltage is further reduced by such a voltage drop and the power supply voltage changes according to the current or temperature, a problem that the operation of a circuit becomes unstable occurs. In addition, there is also a problem that electric power is wasted and heat is generated if there is a voltage drop in a diode.

SUMMARY OF THE INVENTION

The present invention provides a voltage selection circuit capable of suppressing a voltage drop and a semiconductor integrated circuit device capable of preventing overcurrent due to incorrect connection or the like by using the voltage selection circuit.

According to a first aspect of the present invention, there is provided a voltage selection circuit that selects the highest voltage of a plurality of voltages. The voltage selection circuit includes: a first terminal to which a first voltage is input; a second terminal to which a second voltage is input; a third terminal to which a third voltage is input; a fourth terminal from which the highest voltage of the first voltage, the second voltage, and the third voltage is output; a P-type first MOS transistor connected between the first and fourth terminals; a P-type second MOS transistor connected between the second and fourth terminals; a P-type third MOS transistor connected between the third and fourth terminals; a first resistor connected between a gate of the first MOS transistor and the second terminal; a second resistor connected between a gate of the second MOS transistor and the first terminal; a voltage output circuit that outputs a higher voltage of the first and second voltages to a gate of the third MOS transistor; and a switching circuit that connects the third terminal to the gates of the first and second MOS transistors when the third voltage is higher than an output voltage of the voltage output circuit. The first MOS transistor, the second MOS transistor, the third MOS transistor, a P-type MOS transistor included in the voltage output circuit, and a P-type MOS transistor included in the switching circuit have bulks connected to the fourth terminal.

According to the voltage selection circuit described above, when the first voltage is the highest voltage of the first to third voltages, the first voltage is output from the voltage output circuit. Then, since the highest voltage is output from the voltage output circuit, the third MOS transistor having a gate to which the output voltage of the voltage output circuit is input is turned off. The switching circuit is turned off since the third voltage of the third terminal is lower than the output voltage of the voltage output circuit. When the switching circuit is turned off, no current flows through the first resistor. Accordingly, the voltage of the gate of the first MOS transistor becomes almost equal to the second voltage. Since the second voltage input to the gate of the first MOS transistor is lower than the first voltage input to the source of the first MOS transistor, the first MOS transistor is turned on. When the switching circuit is turned off, no current flows through the second resistor. Accordingly, the voltage of the gate of the second MOS transistor becomes almost equal to the first voltage. The second MOS transistor is turned off since the voltage input to the gate is the highest voltage. Therefore, when the first voltage is the highest voltage, the first MOS transistor is turned on, and the second and third MOS transistors are turned off. As a result, the voltage output at the fourth terminal becomes almost equal to the first voltage that is the highest voltage.

In addition, when the second voltage is the highest voltage of the first to third voltages, the second voltage is output from the voltage output circuit. Then, since the highest voltage is output from the voltage output circuit, the third MOS transistor having a gate to which the output voltage of the voltage output circuit is input is turned off. The switching circuit is turned off since the third voltage of the third terminal is lower than the output voltage of the voltage output circuit. When the switching circuit is turned off, no current flows through the first resistor. Accordingly, the voltage of the gate of the first MOS transistor becomes almost equal to the second voltage. The first MOS transistor is turned off since the voltage input to the gate is the highest voltage. When the switching circuit is turned off, no current flows through the second resistor. Accordingly, the voltage of the gate of the second MOS transistor becomes almost equal to the first voltage. Since the first voltage input to the gate of the second MOS transistor is lower than the first voltage input to the source of the second MOS transistor, the second MOS transistor is turned on. Therefore, when the second voltage is the highest voltage, the second MOS transistor is turned on, and the first and third MOS transistors are turned off. As a result, the voltage output at the fourth terminal becomes almost equal to the second voltage that is the highest voltage.

In addition, when the third voltage is the highest voltage of the first to third voltages, the output voltage (the first voltage or the second voltage) of the voltage output circuit is lower than the third voltage. The third MOS transistor is turned on since the output voltage of the voltage output circuit input to the gate of the third MOS transistor is lower than the third voltage input to the source of the third MOS transistor. The switching circuit is turned on since the third voltage of the third terminal is higher than the output voltage of the voltage output circuit. The third voltage of the third terminal is input to the gates of the first and second MOS transistors through the switching circuit. In this case, since the highest voltage is input to the gates of the first and second MOS transistors, the first and second MOS transistors are turned off. Therefore, when the third voltage is the highest voltage, the third MOS transistor is turned on, and the first and second MOS transistors are turned off. As a result, the voltage output at the fourth terminal becomes almost equal to the third voltage that is the highest voltage.

Thus, according to the voltage selection circuit described above, the highest voltage of the first to third voltages is output from the fourth terminal. In this case, since terminals (the first to third terminals) on the input side and a terminal (the fourth terminal) on the output side are connected to each other through MOS transistors (the first to third MOS transistors) in the ON state, it is possible to suppress a voltage drop due to the parasitic diode of each MOS transistor.

Preferably, the voltage output circuit includes a P-type fourth MOS transistor and a third resistor connected in series between the first and second terminals. A gate of the fourth MOS transistor may be connected to one terminal of the third resistor connected to the first terminal or the second terminal. The voltage output circuit may output a higher voltage of the first and second voltages at a connection node between the fourth MOS transistor and the third resistor.

Preferably, the switching circuit includes: a P-type fifth MOS transistor that is provided in a path connecting the gate of the first MOS transistor and the third terminal to each other and that has a gate to which the output voltage of the voltage output circuit is applied; and a P-type sixth MOS transistor that is provided in a path connecting the gate of the second MOS transistor and the third terminal to each other and that has a gate to which the output voltage of the voltage output circuit is applied. In this case, the switching circuit may include at least one P-type seventh MOS transistor that is provided in a path connecting the gate of the first MOS transistor and the third terminal to each other and a path connecting the gate of the second MOS transistor and the third terminal to each other and that has a gate connected to the first terminal or the second terminal.

Preferably, the switching circuit includes: a P-type eighth MOS transistor that is provided in a path connecting the gate of the first MOS transistor and the third terminal to each other and that has a gate connected to the first terminal or the second terminal; a P-type ninth MOS transistor that is provided in a path connecting the gate of the second MOS transistor and the third terminal to each other and that has a gate connected to the first terminal or the second terminal; and at least one P-type tenth MOS transistor that is provided in a path connecting the gate of the first MOS transistor and the third terminal to each other through the eighth MOS transistor and a path connecting the gate of the second MOS transistor and the third terminal to each other through the ninth MOS transistor and that has a gate to which the output voltage of the voltage output circuit is applied.

Preferably, at least one of the first and second resistors is replaced with a diode or a MOS transistor for preventing a current flowing through the switching circuit from the third terminal. Alternatively, the diode or the MOS transistor may be provided in series with at least one of the first and second resistors.

Through the configuration described above, a current flowing from the third terminal to the first terminal or the second terminal through the switching circuit is prevented when the third voltage is the highest electric potential.

The voltage selection circuit described above may further include at least one of an N-type eleventh MOS transistor and an N-type twelfth MOS transistor. Here, the N-type eleventh MOS transistor is provided in a path connecting the first resistor and the second terminal to each other and has a gate connected to the first terminal and a bulk connected to the second terminal, and the N-type twelfth MOS transistor is provided in a path connecting the second resistor and the first terminal to each other and has a gate connected to the second terminal and a bulk connected to the first terminal.

In this case, the voltage selection circuit described above may further include at least one of a first gate voltage control circuit and a second gate voltage control circuit. Here, the first gate voltage control circuit includes: a P-type thirteenth MOS transistor that is provided in a path connecting the gate of the eleventh MOS transistor and the first terminal to each other and that has a gate connected to the third terminal and a bulk connected to the fourth terminal; and a fourth resistor connected between the gate of the eleventh MOS transistor and the second terminal. The second gate voltage control circuit includes: a P-type fourteenth MOS transistor that is provided in a path connecting the gate of the twelfth MOS transistor and the second terminal to each other and that has a gate connected to the third terminal and a bulk connected to the fourth terminal; and a fifth resistor connected between the gate of the twelfth MOS transistor and the first terminal.

Through the configuration described above, a current flowing from the third terminal to the first terminal or the second terminal through the switching circuit is prevented when the third voltage is the highest electric potential.

According to a second aspect of the present invention, there is provided a voltage selection circuit that selects the lowest voltage of a plurality of voltages. The voltage selection circuit includes: a first terminal to which a first voltage is input; a second terminal to which a second voltage is input; a third terminal to which a third voltage is input; a fourth terminal from which the lowest voltage of the first voltage, the second voltage, and the third voltage is output; an N-type first MOS transistor connected between the first and fourth terminals; an N-type second MOS transistor connected between the second and fourth terminals; an N-type third MOS transistor connected between the third and fourth terminals; a first resistor connected between a gate of the first MOS transistor and the second terminal; a second resistor connected between a gate of the second MOS transistor and the first terminal; a voltage output circuit that outputs a higher voltage of the first and second voltages to a gate of the third MOS transistor; and a switching circuit that connects the third terminal to the gates of the first and second MOS transistors when the third voltage is lower than an output voltage of the voltage output circuit. The first MOS transistor, the second MOS transistor, the third MOS transistor, an N-type MOS transistor included in the voltage output circuit, and an N-type MOS transistor included in the switching circuit have bulks connected to the fourth terminal.

According to the voltage selection circuit according to the second aspect of the present invention, when the first voltage is the lowest voltage of the first to third voltages, the first voltage is output from the voltage output circuit. Then, since the lowest voltage is output from the voltage output circuit, the third MOS transistor having a gate to which the output voltage of the voltage output circuit is input is turned off. The switching circuit is turned off since the third voltage of the third terminal is higher than the output voltage of the voltage output circuit. When the switching circuit is turned off, no current flows through the first resistor. Accordingly, the voltage of the gate of the first MOS transistor becomes almost equal to the second voltage. Since the second voltage input to the gate of the first MOS transistor is higher than the first voltage input to the source of the first MOS transistor, the first MOS transistor is turned on. When the switching circuit is turned off, no current flows through the second resistor. Accordingly, the voltage of the gate of the second MOS transistor becomes almost equal to the first voltage. The second MOS transistor is turned off since the voltage input to the gate is the lowest voltage. Therefore, when the first voltage is the lowest voltage, the first MOS transistor is turned on, and the second and third MOS transistors are turned off. As a result, the voltage output at the fourth terminal becomes almost equal to the first voltage that is the lowest voltage.

In addition, when the second voltage is the lowest voltage of the first to third voltages, the second voltage is output from the voltage output circuit. Then, since the lowest voltage is output from the voltage output circuit, the third MOS transistor having a gate to which the output voltage of the voltage output circuit is input is turned off. The switching circuit is turned off since the third voltage of the third terminal is higher than the output voltage of the voltage output circuit. When the switching circuit is turned off, no current flows through the first resistor. Accordingly, the voltage of the gate of the first MOS transistor becomes almost equal to the second voltage. The first MOS transistor is turned off since the voltage input to the gate is the lowest voltage. When the switching circuit is turned off, no current flows through the second resistor. Accordingly, the voltage of the gate of the second MOS transistor becomes almost equal to the first voltage. Since the first voltage input to the gate of the second MOS transistor is higher than the second voltage input to the source of the second MOS transistor, the second MOS transistor is turned on. Therefore, when the second voltage is the lowest voltage, the second MOS transistor is turned on, and the first and third MOS transistors are turned off. As a result, the voltage output at the fourth terminal becomes almost equal to the second voltage that is the lowest voltage.

In addition, when the third voltage is the lowest voltage of the first to third voltages, the output voltage (the first voltage or the second voltage) of the voltage output circuit is higher than the third voltage. The third MOS transistor is turned on since the output voltage of the voltage output circuit input to the gate of the third MOS transistor is higher than the third voltage input to the source of the third MOS transistor. The switching circuit is turned on since the third voltage of the third terminal is lower than the output voltage of the voltage output circuit. The third voltage of the third terminal is input to the gates of the first and second MOS transistors through the switching circuit. In this case, since the lowest voltage is input to the gates of the first and second MOS transistors, the first and second MOS transistors are turned off. Therefore, when the third voltage is the lowest voltage, the third MOS transistor is turned on, and the first and second MOS transistors are turned off. As a result, the voltage output at the fourth terminal becomes almost equal to the third voltage that is the lowest voltage.

Thus, according to the voltage selection circuit according to the second aspect of the present invention, the lowest voltage of the first to third voltages is output from the fourth terminal. In this case, since terminals (the first to third terminals) on the input side and a terminal (the fourth terminal) on the output side are connected to each other through MOS transistors (the first to third MOS transistors) in the ON state, it is possible to suppress a voltage drop due to the parasitic diode of each MOS transistor.

According to a third aspect of the present invention, there is provided a semiconductor integrated circuit device including the voltage selection circuit according to the first aspect of the present invention. A power supply voltage is input at the first terminal. The second terminal is connected to a ground potential. A signal is output or input at the third terminal. At least some of P-type MOS transistors that form a circuit have bulks connected to the fourth terminal of the voltage selection circuit.

According to the configuration described above, since the highest voltage is applied to the bulks of the P-type MOS transistors, no current flows through a parasitic diode formed in the bulk of each P-type MOS transistor.

According to a fourth aspect of the present invention, there is provided a semiconductor integrated circuit device including the voltage selection circuit according to the second aspect of the present invention. A power supply voltage is input at the first terminal. The second terminal is connected to a ground potential. A signal is output or input at the third terminal. At least some of N-type MOS transistors that form a circuit have bulks connected to the fourth terminal of the voltage selection circuit.

According to the configuration described above, since the lowest voltage is applied to the bulks of the N-type MOS transistors, no current flows through a parasitic diode formed in the bulk of each N-type MOS transistor.

According to the aspects of the present invention, it is possible to suppress a voltage drop occurring in the path between the input and the output when selecting one voltage from three voltages.

BRIEF DESCRIPTION OF THE DRAWINGS

FIG. 3A is a cross-sectional view showing the CMOS structure and FIG. 3B is a diagram showing the symbols of a P-type MOS transistor and an N-type MOS transistor that form the CMOS;

FIG. 4A shows a current path in a cross-sectional view of the P-type MOS transistor and FIG. 4B shows a current path in a symbol view of the P-type MOS transistor;

FIG. 5A shows a current path in a cross-sectional view of the P-type MOS transistor and FIG. 5B shows a current path in a symbol view of the P-type MOS transistor;

FIG. 9 is a diagram showing the state of each MOS transistor corresponding to the relative magnitude relationship among the input voltages of the voltage selection circuit;

DESCRIPTION OF THE PREFERRED EMBODIMENTS

First Embodiment

Hereinafter, a voltage selection circuit according to a first embodiment of the present invention will be described with reference to the accompanying diagrams.

Figure 1:
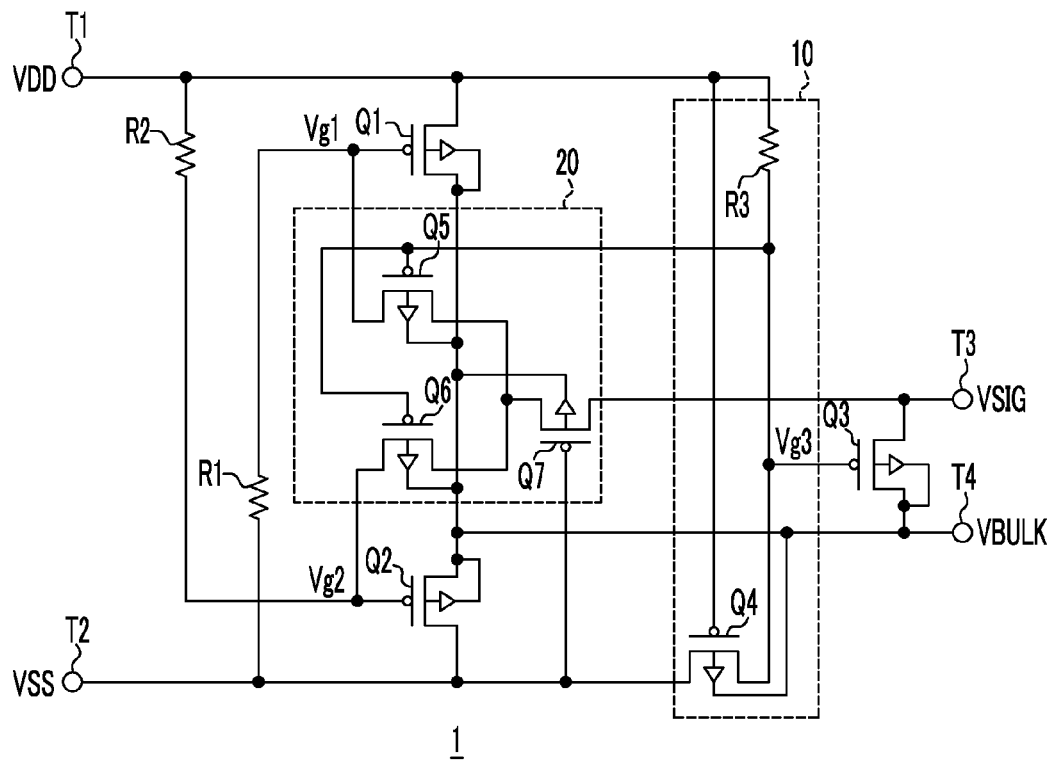
FIG. 1 is a diagram showing an example of the configuration of a voltage selection circuit according to a first embodiment.

FIG. 1 is a diagram showing an example of the configuration of a voltage selection circuit 1 according to the first embodiment of the present invention. The voltage selection circuit 1 shown in FIG. 1 includes a terminal T1 to which a power supply voltage VDD is input, a terminal T2 to which a ground potential VSS is input, a terminal T3 to which a signal voltage VSIG is input, a terminal T4 from which a selection voltage VBULK is output, P-type MOS transistors Q1, Q2, and Q3, resistors R1 and R2, a voltage output circuit 10, and a switching circuit 20.

The terminal T1 is an example of a first terminal in the present invention. The terminal T2 is an example of a second terminal in the present invention. The terminal T3 is an example of a third terminal in the present invention. The terminal T4 is an example of a fourth terminal in the present invention. The MOS transistor Q1 is an example of a first MOS transistor in the present invention. The MOS transistor Q2 is an example of a second MOS transistor in the present invention. The MOS transistor Q3 is an example of a third MOS transistor in the present invention. The resistor R1 is an example of a first resistor in the present invention. The resistor R2 is an example of a second resistor in the present invention. The voltage output circuit 10 is an example of a voltage output circuit in the present invention. The switching circuit 20 is an example of a switching circuit in the present invention.

The MOS transistor Q1 is connected between the terminal T1 and the terminal T4. The MOS transistor Q2 is connected between the terminal T2 and the terminal T4. The MOS transistor Q3 is connected between the terminal T3 and the terminal T4. The resistor R1 is connected between a gate of the MOS transistor Q1 and the terminal T2. The resistor R2 is connected between a gate of the MOS transistor Q2 and the terminal T1.

The voltage output circuit 10 outputs the higher one of the power supply voltage VDD and the ground potential VSS, as a voltage Vg3, to a gate of the MOS transistor Q3.

In the example shown in FIG. 1, the voltage output circuit 10 includes a P-type MOS transistor Q4 and a resistor R3. The MOS transistor Q4 and the resistor R3 are connected in series between the terminal T1 and the terminal T2. A gate of the MOS transistor Q4 is connected to one terminal of the resistor R3 connected to the terminal T1. The voltage Vg3 is output to the gate of the MOS transistor Q3 from the connection node between the MOS transistor Q4 and the resistor R3.

The switching circuit 20 connects the terminal T3 to the gate of each of the MOS transistors Q1 and Q2 when the signal voltage VSIG is higher than the voltage Vg3 of the voltage output circuit 10, and disconnects the terminal T3 from the gate of each of the MOS transistors Q1 and Q2 when the signal voltage VSIG is lower than the voltage Vg3 of the voltage output circuit 10.

In the example of FIG. 1, the switching circuit 20 includes MOS transistors Q5, Q6, and Q7. The MOS transistor Q5 is provided in a path connecting the gate of the MOS transistor Q1 and the terminal T3 to each other, and the voltage Vg3 of the voltage output circuit 10 is applied to a gate of the MOS transistor Q5. The MOS transistor Q6 is provided in a path connecting the gate of the MOS transistor Q2 and the terminal T3 to each other, and the voltage Vg3 of the voltage output circuit 10 is applied to a gate of the MOS transistor Q6. The MOS transistor Q7 is provided in a common portion of the path connecting the terminal T3 and the gate of the MOS transistor Q1 to each other and the path connecting the terminal T3 and the gate of the MOS transistor Q2 to each other, and the gate of the MOS transistor Q7 is connected to the terminal T2. Specifically, one channel terminal of the MOS transistor Q7 is connected to a common connection node of a channel terminal of the MOS transistor Q5 and a channel terminal of the MOS transistor Q6, and the other channel terminal is connected to the terminal T3. The "channel terminal" indicates a drain or a source in a MOS transistor.

A bulk of each P-type MOS transistor (Q1 to Q7) included in the voltage selection circuit 1 is connected to the terminal T4. That is, the selection voltage VBULK is applied to the bulk of each P-type MOS transistor (Q1 to Q7).

Figure 2:
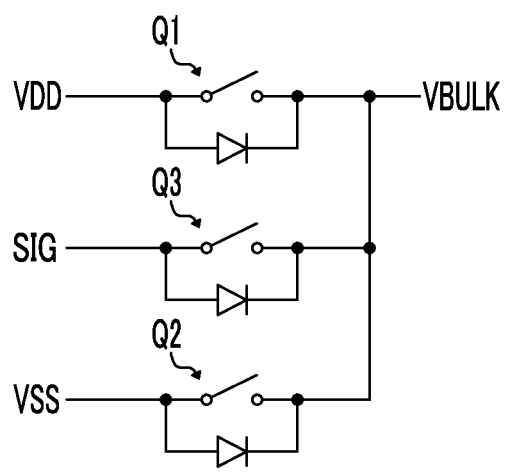
FIG. 2 is a diagram showing an equivalent circuit of the main part of the voltage selection circuit shown in FIG. 1.

A parasitic diode is present between the bulk and the channel terminal (drain or source) of each P-type MOS transistor (Q1 to Q7). Assuming that the channels of the P-type MOS transistors Q1 to Q3 are switches that are turned on or off according to the gate voltage, an equivalent circuit of the main part of the voltage selection circuit 1 shown in FIG. 1 can be expressed as in FIG. 2 by a parasitic diode and a switch. As shown in FIG. 2, each of the P-type MOS transistors Q1 to Q3 can be regarded as a circuit in which a switch and a parasitic diode are connected in parallel to each other.

Here, a parasitic diode of a MOS transistor will be described with reference to FIGS. 3A to 5B.

Figure 3A:
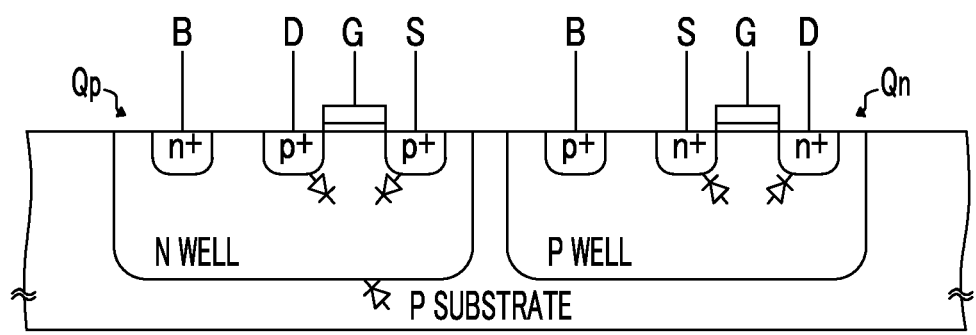
FIGS. 3A and 3B are diagrams for explaining a parasitic diode of a CMOS, where
Figure 3B:
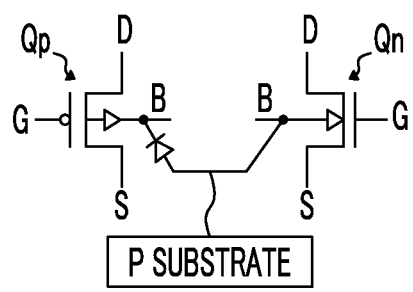

FIGS. 3A and 3B are diagrams for explaining a parasitic diode of a CMOS. FIG. 3A is a cross-sectional view of the CMOS structure, and FIG. 3B is a diagram showing the symbols of a P-type MOS transistor Qp and an N-type MOS transistor Qn that form the CMOS. An N-type diffusion region (N well) and a P-type diffusion region (P well) are formed on the surface of a P-type substrate. Two P-type diffusion regions ($p^+$) serving as a source and a drain of the P-type MOS transistor Qp and an N-type diffusion region ($n^+$) for connecting the N well to a bulk electrode B are formed on the surface of the N well. Two N-type diffusion regions ($n^+$) serving as a source and a drain of the N-type MOS transistor Qn and a P-type diffusion region ($p^+$) for connecting the P well to the bulk electrode B are formed on the surface of the P well.

As shown in FIGS. 3A and 3B, a parasitic diode is formed between the source and the bulk (N well) and between the drain ($p^+$) and the bulk (N well) in the P-type MOS transistor Qp. A current flows through the parasitic diode when the voltage of the source or the drain ($p^+$) becomes higher than the voltage of the bulk (N well).

In addition, a parasitic diode is also formed between the bulk (N well) of the P-type MOS transistor Qp and the P-type substrate. A current flows through the parasitic diode when the voltage of the P-type substrate becomes higher than the voltage of the bulk (N well) of the P-type MOS transistor Qp.

A parasitic diode is also formed between the source and the bulk (P well) and between the drain ($n^+$) and the bulk (P well) in the N-type MOS transistor Qn. A current flows through the parasitic diode when the voltage of the source or the drain ($n^+$) becomes lower than the voltage of the bulk (P well).

Figure 4A:
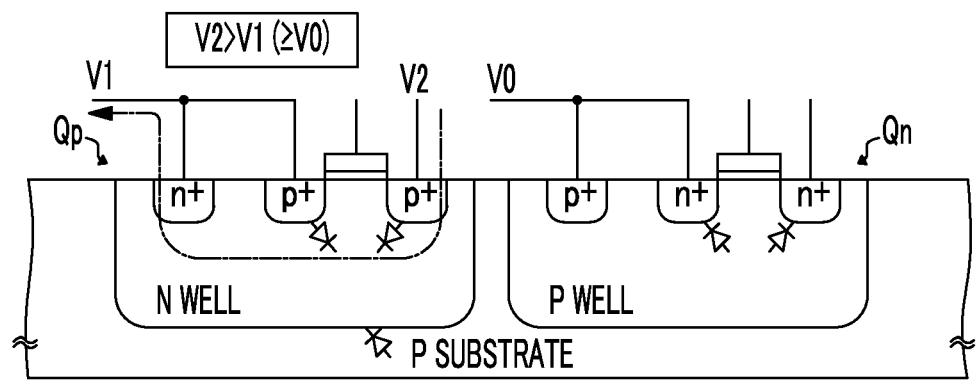
FIGS. 4A and 4B are diagrams for explaining a current path when a current flows through a parasitic diode of a P-type MOS transistor, where
Figure 4B:
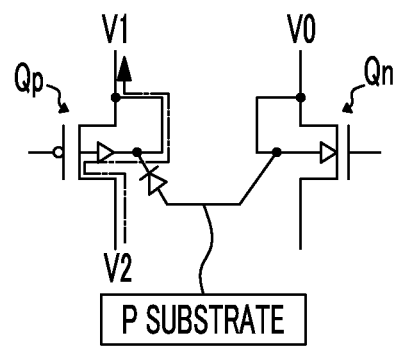

FIGS. 4A and 4B are diagrams for explaining a current path when a current flows through a parasitic diode of the P-type MOS transistor Qp. FIG. 4A shows a current path in a cross-sectional view of the P-type MOS transistor Qp, and FIG. 4B shows a current path in a symbol view of the P-type MOS transistor Qp.

In the example shown in FIG. 4A, a drain and a bulk (N well) of the P-type MOS transistor Qp are connected to each other, and a source and a bulk (N well) of the N-type MOS transistor Qn are connected to each other. The P-type MOS transistor Qp having a drain and a bulk connected to each other corresponds to the MOS transistors Q1 to Q3 in FIG. 1.

In the example shown in FIG. 4A, when a voltage V2 of the source of the P-type MOS transistor Qp becomes higher than a voltage V1 of the drain and the bulk, a current flows through a parasitic diode between the source and the bulk (N well) of the P-type MOS transistor Qp. In this case, as indicated by the one-dot chain line in FIGS. 4A and 4B, a current flows from the source to the drain and the bulk of the P-type MOS transistor Qp through the parasitic diode.

Figure 23:
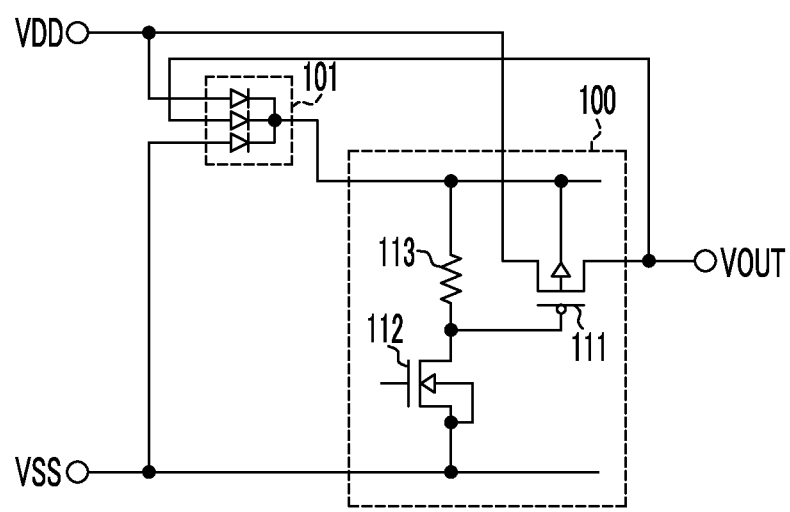
FIG. 23 is a diagram showing an example of a semiconductor integrated circuit device having a function of protecting an internal circuit against incorrect connection among three lines of power supply terminals (positive and negative) and an output terminal.

The state shown in FIGS. 4A and 4B corresponds to a state where the switch is turned off in the equivalent circuit shown in FIG. 2. Assuming that all channels of the MOS transistors Q1 to Q3 are turned off, the equivalent circuit shown in FIG. 2 is in the same state as the circuit 101 in FIG. 23. Accordingly, the highest voltage of the three voltages VDD, VSS, and VSIG is output as the selection voltage VBULK. However, a voltage drop occurs in the parasitic diode. As shown below in FIGS. 5A and 5B, the voltage drop in the parasitic diode is prevented by making a current flow through the channel of the MOS transistor.

Figure 5A:
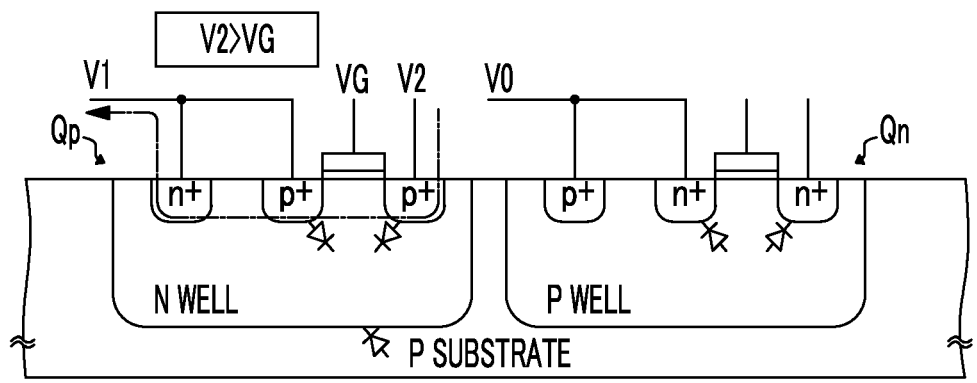
FIGS. 5A and 5B are diagrams for explaining a current path when a current flows through a channel of a P-type MOS transistor, where
Figure 5B:
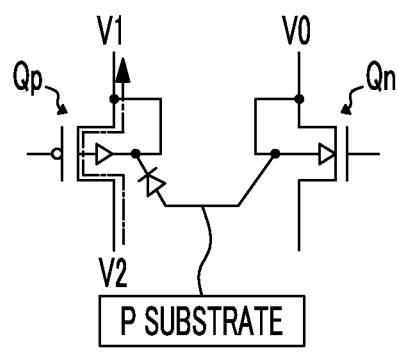

FIGS. 5A and 5B are diagrams for explaining a current path when a current flows through the channel of the P-type MOS transistor Qp. FIG. 5A shows a current path in a cross-sectional view of the P-type MOS transistor Qp, and FIG. 5B shows a current path in a symbol view of the P-type MOS transistor Qp.

When a voltage VG that is lower than the voltage V2 of the source of the P-type MOS transistor Qp by a threshold voltage or more is applied to the gate, a current flows through the channel of the P-type MOS transistor Qp. In this case, as indicated by the one-dot chain line in FIGS. 5A and 5B, since a current flows from the source to the drain and the bulk of the P-type MOS transistor Qp through the channel, a voltage drop due to the parasitic diode does not occur.

In the voltage selection circuit 1 shown in FIG. 1, any one of the P-type MOS transistors Q1 to Q3 is turned on according to the relative magnitude relationship among the voltages VDD, VSIG, and VSS of the terminals T1 to T3. The highest voltage of the voltages VDD, VSIG, and VSS is output from the terminal T4 through the P-type MOS transistor in the ON state. Therefore, a voltage drop due to the parasitic diode of the P-type MOS transistor does not occur.

Next, states of the P-type MOS transistors Q1 to Q3 when the voltages VDD, VSIG, and VSS of the terminals T1 to T3 are in various relationships will be described.

(1) Case of VDD>VSIG>VSS

For easy understanding of explanation, power supply voltage VDD=4 V, signal voltage VSIG=2 V, and ground potential VSS=0 V are assumed. Even if all of the MOS transistors Q1 to Q3 are turned off, the selection voltage VBULK of the terminal T4 becomes a voltage close to 4 V since a current flows through parasitic diodes of the MOS transistors Q1 to Q3. Therefore, bulks of all of the MOS transistors Q1 to Q7 have a voltage close to 4 V.

The MOS transistor Q4 is turned off since the power supply voltage VDD input to the gate is the highest voltage (4 V). When the MOS transistor Q4 is OFF, no voltage drop occurs in the resistor R3. Accordingly, the output voltage Vg3 of the voltage output circuit 10 in the connection node between the MOS transistor Q4 and the resistor R3 is almost equal to the power supply voltage VDD. Since the voltage Vg3 is the highest voltage (4 V), all of the MOS transistors Q3, Q5, and Q6 having gates to which the voltage Vg3 is input are turned off.

Since both of the MOS transistor Q5 and Q6 are OFF, the switching circuit 20 disconnects the gates of the MOS transistors Q1 and Q2 and the terminal T3 from each other (the switching circuit 20 is turned off). Since the switching circuit 20 is in the OFF state, no current flows through the resistor R1 connected to the gate of the MOS transistor Q1. Accordingly, no voltage drop occurs. Therefore, a voltage Vg1 of the gate of the MOS transistor Q1 is almost equal to the ground potential VSS (=0 V). The MOS transistor Q1 is turned on since the voltage Vg1 (=0 V) of the gate is lower than the power supply voltage VDD (=4 V) of the source.

In addition, since the switching circuit 20 is in the OFF state, no current flows through the resistor R2 connected to the gate of the MOS transistor Q2. Accordingly, no voltage drop occurs. Therefore, a voltage Vg2 of the gate of the MOS transistor Q2 is almost equal to the power supply voltage VDD (=4 V). The MOS transistor Q2 is turned off since the voltage Vg2 of the gate is the highest voltage (4 V).

Figure 6:
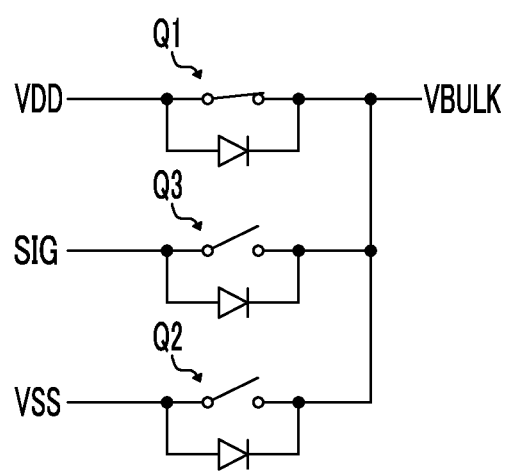
FIG. 6 is a diagram showing an equivalent circuit of the main part of a voltage selection circuit when the power supply voltage is the highest voltage.

Therefore, in the case of "VDD>VSIG>VSS", the MOS transistor Q1 is turned on and the MOS transistors Q2 and Q3 are turned off. The equivalent circuit of the main part of the voltage selection circuit 1 is in a state shown in FIG. 6. As shown in FIG. 6, since the terminal T4 and the terminal T1 are connected to each other through the MOS transistor Q1, the selection voltage VBULK of the terminal T4 is almost equal to the power supply voltage VDD. Since the MOS transistor Q1 is turned on so that no current flows through a parasitic diode, a voltage drop or power loss due to the parasitic diode does not occur.

Also in cases of "VDD=VSIG>VSS" and "VDD>VSIG=VSS", the MOS transistor Q1 is turned on and the MOS transistors Q2 and Q3 are turned off by the same operation as described above. That is, when the power supply voltage VDD is the highest voltage and the ground potential VSS is the lowest voltage, the voltage Vg3 output from the voltage output circuit 10 becomes the highest voltage (power supply voltage VDD), and the voltage Vg3 does not become lower than the voltages of the sources of the MOS transistors Q3, Q5, and Q6. Accordingly, the MOS transistors Q3, Q5, and Q6 are turned off. Since the switching circuit 20 is in the OFF state (MOS transistors Q5 and Q6 are OFF), the voltage Vg1 becomes the lowest voltage (ground potential VSS) to turn on the MOS transistor Q1, and the voltage Vg2 becomes the highest voltage (power supply voltage VDD) to turn off the MOS transistor Q2. Accordingly, also in the cases of "VDD=VSIG>VSS" and "VDD>VSIG=VSS", the selection voltage VBULK of the terminal T4 is almost equal to the power supply voltage VDD.

(2) Case of VDD>VSS>VSIG

For easy understanding of explanation, power supply voltage VDD=4 V, ground potential VSS=2 V, and signal voltage VSIG=0 V are assumed. Even if all of the MOS transistors Q1 to Q3 are turned off, the bulks of all of the MOS transistors Q1 to Q7 have a voltage close to 4 V by electrical conduction of a parasitic diode.

The MOS transistor Q4 is turned off since the power supply voltage VDD input to the gate is the highest voltage (4 V). Accordingly, the output voltage Vg3 of the voltage output circuit 10 becomes 4 V that is the same as the power supply voltage VDD. When the voltage Vg3 becomes the highest voltage (4 V), the MOS transistors Q3, Q5, and Q6 are turned off. When the MOS transistors Q5 and Q6 are turned off (when the switching circuit 20 is turned off), no current flows through the resistors R1 and R2. Accordingly, the voltage Vg1 becomes equal to the ground potential VSS (=2 V), and the voltage Vg2 becomes equal to the power supply voltage VDD (=4 V). As a result, the MOS transistor Q1 is turned on, and the MOS transistor Q2 is turned off.

Therefore, in the case of "VDD>VSIG>VSS", the MOS transistor Q1 is turned on, and the MOS transistors Q2 and Q3 are turned off. The equivalent circuit of the main part of the voltage selection circuit 1 is in a state shown in FIG. 6, and the selection voltage VBULK of the terminal T4 is almost equal to the power supply voltage VDD. Since the MOS transistor Q1 is turned on so that no current flows through a parasitic diode, a voltage drop or power loss due to the parasitic diode does not occur.

(3) Case of VSIG>VDD>VSS

For easy understanding of explanation, signal voltage VSIG=4 V, power supply voltage VDD=2 V, and ground potential VSS=0 V are assumed. Even if all of the MOS transistors Q1 to Q3 are turned off, the bulks of all of the MOS transistors Q1 to Q7 have a voltage close to 4 V by electrical conduction of a parasitic diode.

The source (channel terminal on the high potential side) of the MOS transistor Q4 is connected to the gate through the resistor R3, and 2 V is input to the gate as the power supply voltage VDD. Since the voltage of the gate of the MOS transistor Q4 is not lower than the voltage of the source, the MOS transistor Q4 is turned off. When the MOS transistor Q4 is turned off, the voltage Vg3 becomes the power supply voltage VDD=2 V. The MOS transistor Q3 is turned on since the voltage Vg3 (=2 V) input to the gate is lower than the signal voltage VSIG (=4 V) input to the source.

The MOS transistor Q7 is turned on since the ground potential VSS (=0 V) input to the gate is lower than the signal voltage VSIG (=4 V) input to the source. The MOS transistors Q5 and Q6 are turned on since the voltage Vg3 (=2 V) input to the gate is lower than the signal voltage VSIG (=4 V) input to the source through the MOS transistor Q7. That is, all of the MOS transistors Q5, Q6, and Q7 are turned on. Accordingly, the switching circuit 20 connects the gates of the MOS transistors Q1 and Q2 and the terminal T3 to each other (switching circuit 20 is turned on). When the switching circuit 20 is turned on, the signal voltage VSIG=4 V is input to the gates of the MOS transistors Q1 and Q2 through the switching circuit 20. When the on-resistance of the switching circuit 20 (on-resistance of Q5, Q6, and Q7) is sufficiently smaller than the resistance values of the resistors R1 and R2, the voltages Vg1 and Vg2 are almost equal to the signal voltage VSIG (=4 V). The MOS transistors Q1 and Q2 are turned off since the voltages Vg1 and Vg2 of the gates are equal to the highest voltage (4 V).

Figure 7:
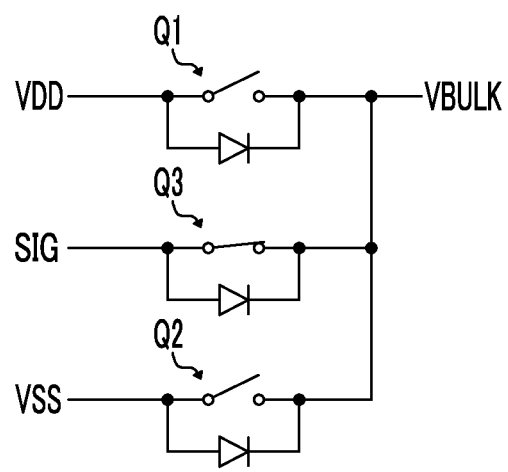
FIG. 7 is a diagram showing an equivalent circuit of the main part of a voltage selection circuit when the signal voltage is the highest voltage.

Therefore, in the case of "VSIG>VDD>VSS", the MOS transistor Q3 is turned on, and the MOS transistors Q1 and Q2 are turned off. The equivalent circuit of the main part of the voltage selection circuit 1 is in a state shown in FIG. 7. As shown in FIG. 7, since the terminal T3 and the terminal T4 are connected to each other through the MOS transistor Q3, the selection voltage VBULK of the terminal T4 is almost equal to the signal voltage VSIG. Since the MOS transistor Q3 is turned on so that no current flows through a parasitic diode, a voltage drop or power loss due to the parasitic diode does not occur.

(4) Case of VSIG>VSS>VDD

For easy understanding of explanation, signal voltage VSIG=4 V, ground potential VSS=2 V, and power supply voltage VDD=0 V are assumed. Even if all of the MOS transistors Q1 to Q3 are turned off, the bulks of all of the MOS transistors Q1 to Q7 have a voltage close to 4 V by electrical conduction of a parasitic diode.

The MOS transistor Q4 is turned on since the power supply voltage VDD (=0 V) input to the gate is lower than the ground potential VSS (=2 V) input to the source (channel terminal on the high potential side). When the MOS transistor Q4 is turned on, if the on-resistance of the MOS transistor Q4 is sufficiently smaller than the resistance value of the resistor R3, the voltage Vg3 becomes almost equal to the ground potential VSS (=2 V). The MOS transistor Q3 is turned on since the voltage Vg3 (=2 V) input to the gate is lower than the signal voltage VSIG (=4 V) input to the source.

The MOS transistor Q7 is turned on since the ground potential VSS (=2 V) input to the gate is lower than the signal voltage VSIG (=4 V) input to the source. The MOS transistors Q5 and Q6 are turned on since the voltage Vg3 (=2 V) input to the gate is lower than the signal voltage VSIG (=4 V) input to the source through the MOS transistor Q7. That is, all of the MOS transistors Q5, Q6, and Q7 are turned on, and accordingly, the switching circuit 20 is turned on. When the on-resistance of the switching circuit 20 (on-resistance of Q5, Q6, and Q7) is sufficiently smaller than the resistance values of the resistors R1 and R2, the voltages Vg1 and Vg2 of the gates of the MOS transistors Q1 and Q2 are almost equal to the signal voltage VSIG (=4 V). Accordingly, the MOS transistors Q1 and Q2 are turned off.

Therefore, in the case of "VSIG>VSS>VDD", the MOS transistor Q3 is turned on, and the MOS transistors Q1 and Q2 are turned off. The equivalent circuit of the main part of the voltage selection circuit 1 is in a state shown in FIG. 7, and the selection voltage VBULK of the terminal T4 is almost equal to the signal voltage VSIG. Since the MOS transistor Q3 is turned on so that no current flows through a parasitic diode, a voltage drop or power loss due to the parasitic diode does not occur.

(5) Case of VSS>VSIG>VDD

For easy understanding of explanation, ground potential VSS=4 V, signal voltage VSIG=2 V, and power supply voltage VDD=0 V are assumed. Even if all of the MOS transistors Q1 to Q3 are turned off, the bulks of all of the MOS transistors Q1 to Q7 have a voltage close to 4 V by electrical conduction of a parasitic diode.

The MOS transistor Q4 is turned on since the power supply voltage VDD (=0 V) input to the gate is lower than the ground potential VSS (=4 V) input to the source (channel terminal on the high potential side). When the MOS transistor Q4 is turned on, if the on-resistance of the MOS transistor Q4 is sufficiently smaller than the resistance value of the resistor R3, the voltage Vg3 becomes almost equal to the ground potential VSS (=4 V). When the voltage Vg3 becomes the highest voltage (4 V), the MOS transistors Q3, Q5, and Q6 are turned off. When the MOS transistors Q5 and Q6 are turned off (when the switching circuit 20 is turned off), no current flows through the resistors R1 and R2. Accordingly, the voltage Vg1 becomes equal to the ground potential VSS (=4 V), and the voltage Vg2 becomes equal to the power supply voltage VDD (=0 V). As a result, the MOS transistor Q1 is turned off, and the MOS transistor Q2 is turned on.

Figure 8:
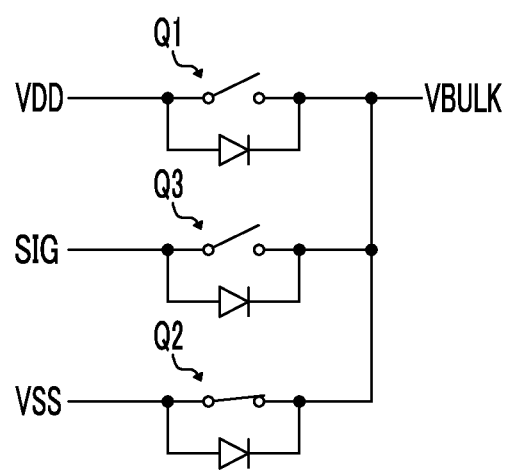
FIG. 8 is a diagram showing an equivalent circuit of the main part of a voltage selection circuit when the ground potential is the highest voltage.

Therefore, in the case of "VSS>VSIG>VDD", the MOS transistor Q2 is turned on, and the MOS transistors Q1 and Q3 are turned off. The equivalent circuit of the main part of the voltage selection circuit 1 is in a state shown in FIG. 8. As shown in FIG. 8, since the terminal T2 and the terminal T4 are connected to each other through the MOS transistor Q2, the selection voltage VBULK is almost equal to the ground potential VSS. Since the MOS transistor Q2 is turned on so that no current flows through a parasitic diode, a voltage drop due to the parasitic diode does not occur.

(6) Case of VSS>VDD>VSIG

For easy understanding of explanation, ground potential VSS=4 V, power supply voltage VDD=2 V, and signal voltage VSIG=0 V are assumed. Even if all of the MOS transistors Q1 to Q3 are turned off, the bulks of all of the MOS transistors Q1 to Q7 have a voltage close to 4 V by electrical conduction of a parasitic diode.

The MOS transistor Q4 is turned on since the power supply voltage VDD (=2 V) input to the gate is lower than the ground potential VSS (=4 V) input to the source (channel terminal on the high potential side). When the MOS transistor Q4 is turned on, if the on-resistance of the MOS transistor Q4 is sufficiently smaller than the resistance value of the resistor R3, the voltage Vg3 becomes almost equal to the ground potential VSS (=4 V). When the voltage Vg3 becomes the highest voltage (4 V), the MOS transistors Q3, Q5, and Q6 are turned off. When the MOS transistors Q5 and Q6 are turned off (when the switching circuit 20 is turned off), no current flows through the resistors R1 and R2. Accordingly, the voltage Vg1 becomes equal to the ground potential VSS (=4 V), and the voltage Vg2 becomes equal to the power supply voltage VDD (=2 V). As a result, the MOS transistor Q1 is turned off, and the MOS transistor Q2 is turned on.

Therefore, in the case of "VSS>VDD>VSIG", the MOS transistor Q2 is turned on, and the MOS transistors Q1 and Q3 are turned off. The equivalent circuit of the main part of the voltage selection circuit 1 is in a state shown in FIG. 8, the selection voltage VBULK of the terminal T4 is almost equal to the ground potential VSS. Since the MOS transistor Q2 is turned on so that no current flows through a parasitic diode, a voltage drop or power loss due to the parasitic diode does not occur.

The state (ON or OFF) of each MOS transistor in the above-described cases (1) to (6) is summarized as shown in FIG. 9. FIG. 9 is a diagram showing the states of the MOS transistors Q1 to Q7 corresponding to the relative magnitude relationship among the input voltages VDD, VSIG, and VSS of the voltage selection circuit 1. In FIG. 9, columns of "VDD", "VSIG", and "VSS" indicate a voltage value [V]. Columns of "Q4", "Q7", "Q5, Q6", "Q1", "Q2", and "Q3" indicate the state (ON or OFF) of each MOS transistor. "1" indicates an ON state, and "0" indicates an OFF state.

As described above, according to the voltage selection circuit 1 of the present embodiment, when the power supply voltage VDD is the highest voltage of the power supply voltage VDD, the ground potential VSS, and the signal voltage VSIG, the power supply voltage VDD is output as the voltage Vg3 from the voltage output circuit 10. Then, since the voltage Vg3 becomes the highest voltage, the MOS transistor Q3 having a gate to which the voltage Vg3 is input is turned off. Since the signal voltage VSIG of the terminal T3 is lower than the voltage Vg3, the switching circuit 20 is turned off. When the switching circuit 20 is turned off, no current flows through the resistor R1. Accordingly, the voltage Vg1 of the gate of the MOS transistor Q1 becomes almost equal to the ground potential VSS. Since the voltage Vg1 input to the gate of the MOS transistor Q1 is lower than the power supply voltage VDD input to the source of the MOS transistor Q1, the MOS transistor Q1 is turned on. When the switching circuit 20 is turned off, no current flows through the resistor R2. Accordingly, the voltage Vg2 of the gate of the MOS transistor Q2 becomes almost equal to the power supply voltage VDD. The MOS transistor Q2 is turned off since the voltage Vg2 of the gate is the highest voltage. Therefore, when the power supply voltage VDD is the highest voltage, the MOS transistor Q1 is turned on, and the MOS transistors Q2 and Q3 are turned off. As a result, the selection voltage VBULK of the terminal T4 becomes almost equal to the power supply voltage VDD that is the highest voltage.

When the ground potential VSS is the highest voltage of the power supply voltage VDD, the ground potential VSS, and the signal voltage VSIG, the ground potential VSS is output as the voltage Vg3 from the voltage output circuit 10. Then, since the voltage Vg3 becomes the highest voltage, the MOS transistor Q3 having a gate to which the voltage Vg3 is input is turned off. Since the signal voltage VSIG of the terminal T3 is lower than the voltage Vg3, the switching circuit 20 is turned off. When the switching circuit 20 is turned off, no current flows through the resistor R1. Accordingly, the voltage Vg1 of the gate of the MOS transistor Q1 becomes almost equal to the ground potential VSS. The MOS transistor Q1 is turned off since the voltage Vg1 of the gate is the highest voltage. When the switching circuit 20 is turned off, no current flows through the resistor R2. Accordingly, the voltage Vg2 of the gate of the MOS transistor Q2 becomes almost equal to the power supply voltage VDD. Since the voltage Vg2 input to the gate of the MOS transistor Q2 is lower than the ground potential VSS input to the source of the MOS transistor Q2, the MOS transistor Q2 is turned on. Therefore, when the ground potential VSS is the highest voltage, the MOS transistor Q2 is turned on, and the MOS transistors Q1 and Q3 are turned off. As a result, the selection voltage VBULK of the terminal T4 becomes almost equal to the ground potential VSS that is the highest voltage.

When the signal voltage VSIG is the highest voltage of the power supply voltage VDD, the ground potential VSS, and the signal voltage VSIG, the voltage Vg3 (the power supply voltage VDD or the ground potential VSS) output from the voltage output circuit 10 is lower than the signal voltage VSIG. The MOS transistor Q3 is turned on since the voltage Vg3 input to the gate is lower than the signal voltage VSIG input to the source. In addition, since the signal voltage VSIG of the terminal T3 is higher than the voltage Vg3, the switching circuit 20 is turned on. The signal voltage VSIG of the terminal T3 is input to the gates of the MOS transistors Q1 and Q2 through the switching circuit 20. Accordingly, since the gate voltages Vg1 and Vg2 of the MOS transistors Q1 and Q2 become the highest voltage, the MOS transistors Q1 and Q2 are turned off. Therefore, when the signal voltage VSIG is the highest voltage, the MOS transistor Q3 is turned on, and the MOS transistors Q1 and Q2 are turned off. As a result, the selection voltage VBULK of the terminal T4 becomes almost equal to the signal voltage VSIG that is the highest voltage.

Thus, according to the voltage selection circuit 1 of the present embodiment, the highest voltage of the power supply voltage VDD, the ground potential VSS, and the signal voltage VSIG is output as the selection voltage VBULK from the terminal T4. In this case, since the terminals T1 to T3 on the input side and the terminal T4 on the output side are connected to each other through the MOS transistors Q1 to Q3 in the ON state, it is possible to suppress a voltage drop due to the parasitic diode of each MOS transistor. As a result, even when a relatively low voltage is input to the terminals T1 to T3 on the input side, it is possible to output the selection voltage VBULK from the terminal T4, a difference between the selection voltage VBULK and the input voltage being small. In addition, even when a relatively large current flows at the terminal T4, it is possible to suppress a voltage drop in the selection voltage VBULK. In this case, since power loss hardly occurs in a parasitic diode, it is possible to reduce heat generation.

Second Embodiment

Next, a second embodiment of the present invention will be described.

Figure 10:
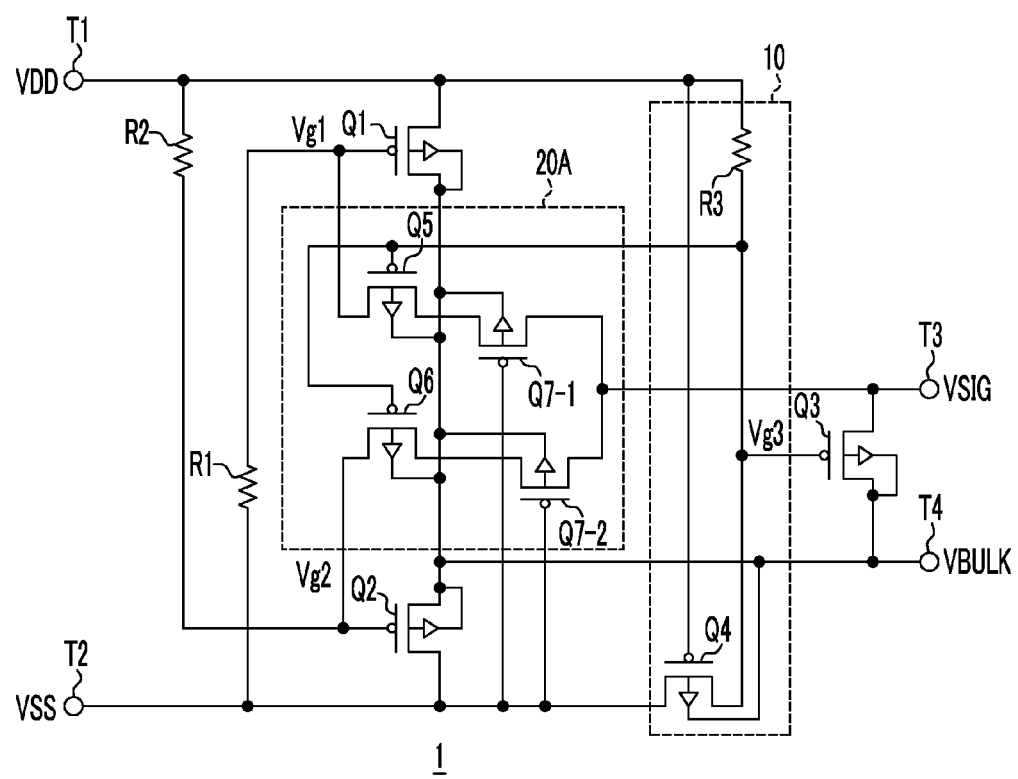
FIG. 10 is a diagram showing an example of the configuration of a voltage selection circuit according to a second embodiment.

FIG. 10 is a diagram showing an example of the configuration of the voltage selection circuit 1 according to the second embodiment. A voltage selection circuit 1 shown in FIG. 10 is formed by replacing the switching circuit 20 in the voltage selection circuit 1 shown in FIG. 1 with a switching circuit 20A. Other configurations of the voltage selection circuit 1 shown in FIG. 10 are the same as the voltage selection circuit 1 shown in FIG. 1.

The switching circuit 20A is formed by replacing one MOS transistor Q7 in the switching circuit 20 with two MOS transistors Q7-1 and Q7-2.

The MOS transistor Q7-1 and the MOS transistor Q5 are provided in series in a path connecting the gate of the MOS transistor Q1 and the terminal T3 to each other. One channel terminal of the MOS transistor Q7-1 is connected to the terminal T3, and the other channel terminal is connected to the gate of the MOS transistor Q1 through the MOS transistor Q5.

The MOS transistor Q7-2 and the MOS transistor Q6 are provided in series in a path connecting the gate of the MOS transistor Q2 and the terminal T3 to each other. One channel terminal of the MOS transistor Q7-2 is connected to the terminal T3, and the other channel terminal is connected to the gate of the MOS transistor Q2 through the MOS transistor Q6. The gates of the MOS transistors Q7-1 and Q7-2 are connected to the terminal T2.

The signal voltage VSIG is input to the sources of the MOS transistors Q7-1 and Q7-2 similar to the MOS transistor Q7 in FIG. 1, and the ground potential VSS is input to the gates of the MOS transistors Q7-1 and Q7-2 similar to the MOS transistor Q7. Therefore, the MOS transistors Q7-1 and Q7-2 are turned on or turned off under the same conditions as for the MOS transistor Q7 in FIG. 1. The operation of the MOS transistors Q7-1 and Q7-2 is the same as the operation of the MOS transistor Q7 in FIG. 1 in that the gates of the MOS transistors Q1 and Q2 and the terminal T3 are connected to each other or disconnected from each other by ON/OFF of the MOS transistors Q7-1 and Q7-2. Therefore, since the voltage selection circuit 1 shown in FIG. 10 operates in the same manner as the voltage selection circuit 1 shown in FIG. 1, it is possible to achieve the same effect.

Third Embodiment

Next, a third embodiment of the present invention will be described.

Figure 11:
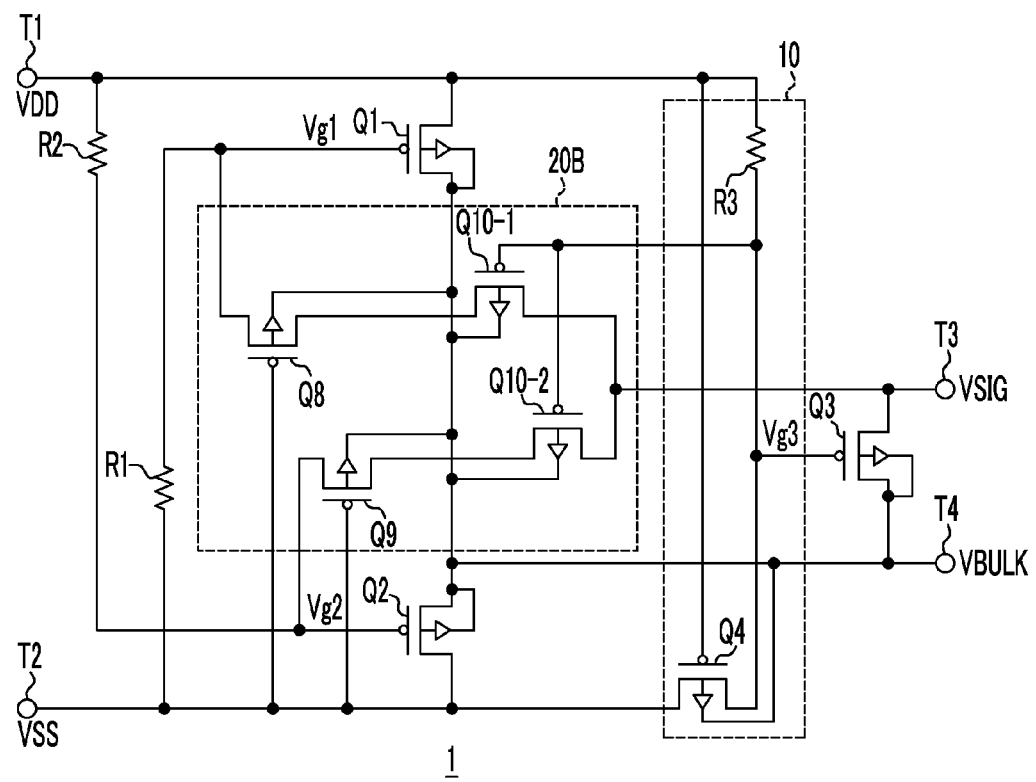
FIG. 11 is a diagram showing an example of the configuration of a voltage selection circuit according to a third embodiment.

FIG. 11 is a diagram showing an example of the configuration of the voltage selection circuit 1 according to the second embodiment. A voltage selection circuit 1 shown in FIG. 11 is formed by replacing the switching circuit 20 in the voltage selection circuit 1 shown in FIG. 1 with a switching circuit 20B. Other configurations of the voltage selection circuit 1 shown in FIG. 11 are the same as the voltage selection circuit 1 shown in FIG. 1.

The switching circuit 20B includes P-type MOS transistors Q8, Q9, Q10-1, and Q10-2.

The MOS transistor Q8 is an example of an eighth MOS transistor in the present invention.

The MOS transistor Q9 is an example of a ninth MOS transistor in the present invention.

The MOS transistors Q10-1 and Q10-2 are examples of a tenth MOS transistor in the present invention.

The MOS transistor Q8 and the MOS transistor Q10-1 are provided in series in a path connecting the gate of the MOS transistor Q1 and the terminal T3 to each other. The MOS transistor Q10-1 is provided in a path connecting the gate of the MOS transistor Q1 and the terminal T3 to each other through the MOS transistor Q8. That is, one channel terminal of the MOS transistor Q10-1 is connected to the terminal T3, and the other channel terminal is connected to the gate of the MOS transistor Q1 through the MOS transistor Q8.

The MOS transistor Q9 and the MOS transistor Q10-2 are provided in series in a path connecting the gate of the MOS transistor Q2 and the terminal T3 to each other. The MOS transistor Q10-2 is provided in a path connecting the gate of the MOS transistor Q2 and the terminal T3 to each other through the MOS transistor Q9. That is, one channel terminal of the MOS transistor Q10-2 is connected to the terminal T3, and the other channel terminal is connected to the gate of the MOS transistor Q2 through the MOS transistor Q9.

When the power supply voltage VDD or the ground potential VSS is the highest voltage that is higher than the signal voltage VSIG, the output voltage Vg3 of the voltage output circuit 10 is the highest voltage. Accordingly, the signal voltage VSIG is lower than the voltage Vg3. In this case, the MOS transistors Q10-1 and Q10-2 are turned off since the voltage of the gate of each of the MOS transistors Q10-1 and Q10-2 is the highest voltage. Therefore, the gates of the MOS transistors Q1 and Q2 are disconnected from the terminal T3, and the switching circuit 20B is turned off.

On the other hand, when the signal voltage VSIG is the highest voltage that is higher than the power supply voltage VDD and the ground potential VSS, the signal voltage VSIG is higher than the output voltage Vg3 of the voltage output circuit 10. In this case, since the voltage Vg3 input to the gates of the MOS transistors Q10-1 and Q10-2 is lower than the signal voltage VSIG input to the sources of the MOS transistors Q10-1 and Q10-2, the MOS transistors Q10-1 and Q10-2 are turned on. When the MOS transistors Q10-1 and Q10-2 are turned on, the signal voltage VSIG is input to the sources of the MOS transistors Q8 and Q9. The MOS transistors Q8 and Q9 are also turned on since the ground potential VSS input to the gates is lower than the signal voltage VSIG input to the sources. Therefore, since all of the MOS transistors Q8, Q9, Q10-1, and Q10-2 are turned on, the gates of the MOS transistors Q1 and Q2 are connected to the terminal T3, and the switching circuit 20B is turned on.

Thus, the switching circuit 20B operates in the same manner as the switching circuit 20 described above since the switching circuit 20B is turned off when the signal voltage VSIG is lower than the output voltage Vg3 of the voltage output circuit 10 and is turned on when the signal voltage VSIG is higher than the output voltage Vg3 of the voltage output circuit 10. Therefore, since the voltage selection circuit 1 shown in FIG. 11 operates in the same manner as the voltage selection circuit 1 shown in FIG. 1, it is possible to achieve the same effect.

Fourth Embodiment

Next, a fourth embodiment of the present invention will be described.

Figure 12:
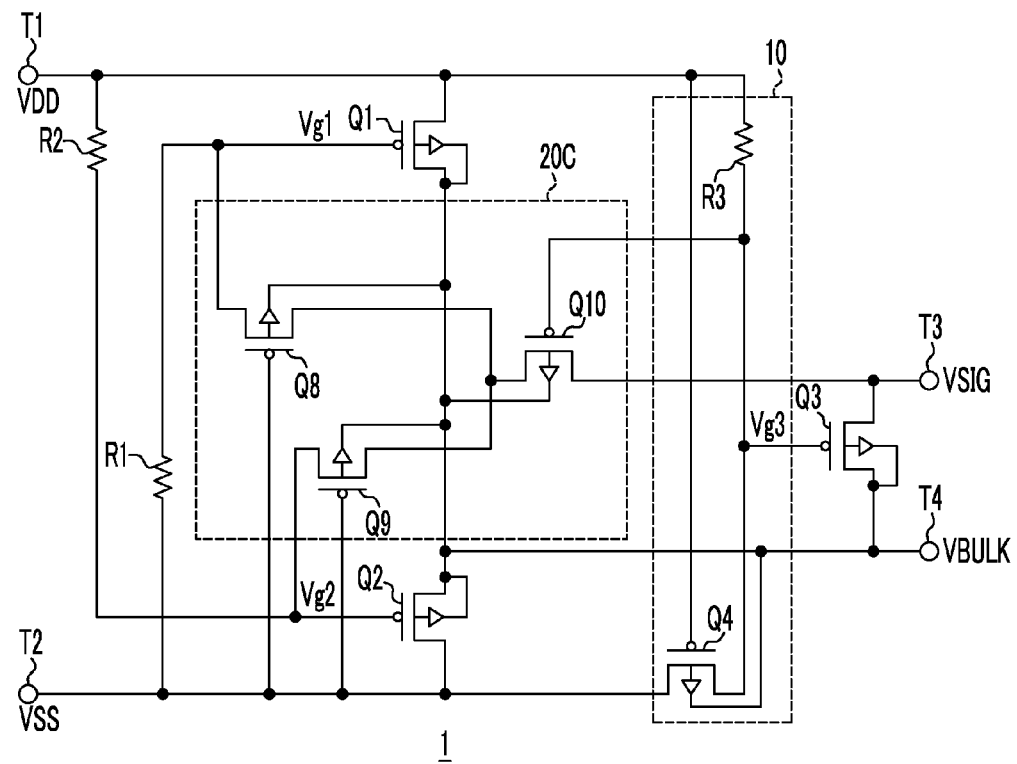
FIG. 12 is a diagram showing an example of the configuration of a voltage selection circuit according to a fourth embodiment.

FIG. 12 is a diagram showing an example of the configuration of the voltage selection circuit 1 according to the fourth embodiment. A voltage selection circuit 1 shown in FIG. 12 is formed by replacing the switching circuit 20B in the voltage selection circuit 1 shown in FIG. 11 with a switching circuit 20C. Other configurations of the voltage selection circuit 1 shown in FIG. 12 are the same as the voltage selection circuit 1 shown in FIG. 11.

The switching circuit 20C is formed by replacing the two MOS transistors Q10-1 and Q10-2 in the switching circuit 20B with one MOS transistor Q10.

The MOS transistor Q10 is provided in a common portion of the path connecting the gate of the MOS transistor Q1 and the terminal T3 to each other and the path connecting the gate of the MOS transistor Q2 and the terminal T3 to each other. One channel terminal of the MOS transistor Q10 is connected to the terminal T3, and the other channel terminal is connected to the gate of the MOS transistor Q1 through the MOS transistor Q8 and is connected to the gate of the MOS transistor Q2 through the MOS transistor Q9. The voltage Vg3 is input to the gate of the MOS transistor Q10.

The signal voltage VSIG is input to the source of the MOS transistor Q10 similar to the MOS transistors Q10-1 and Q10-2 in FIG. 11, and the voltage Vg3 is input to the gate of the MOS transistor Q10 similar to the MOS transistors Q10-1 and Q10-2. Therefore, the MOS transistor Q10 is turned on or turned off under the same conditions as for the MOS transistors Q10-1 and Q10-2 in FIG. 11. The operation of the MOS transistor Q10 is the same as the operation of the MOS transistors Q10-1 and Q10-2 in FIG. 11 in that the gates of the MOS transistors Q1 and Q2 and the terminal T3 are connected to each other or disconnected from each other by ON/OFF of the MOS transistor Q10. Therefore, since the voltage selection circuit 1 shown in FIG. 12 operates similar to the voltage selection circuit 1 shown in FIG. 11, it is possible to achieve the same effect.

Fifth Embodiment

Next, a fifth embodiment of the present invention will be described.

Figure 13:
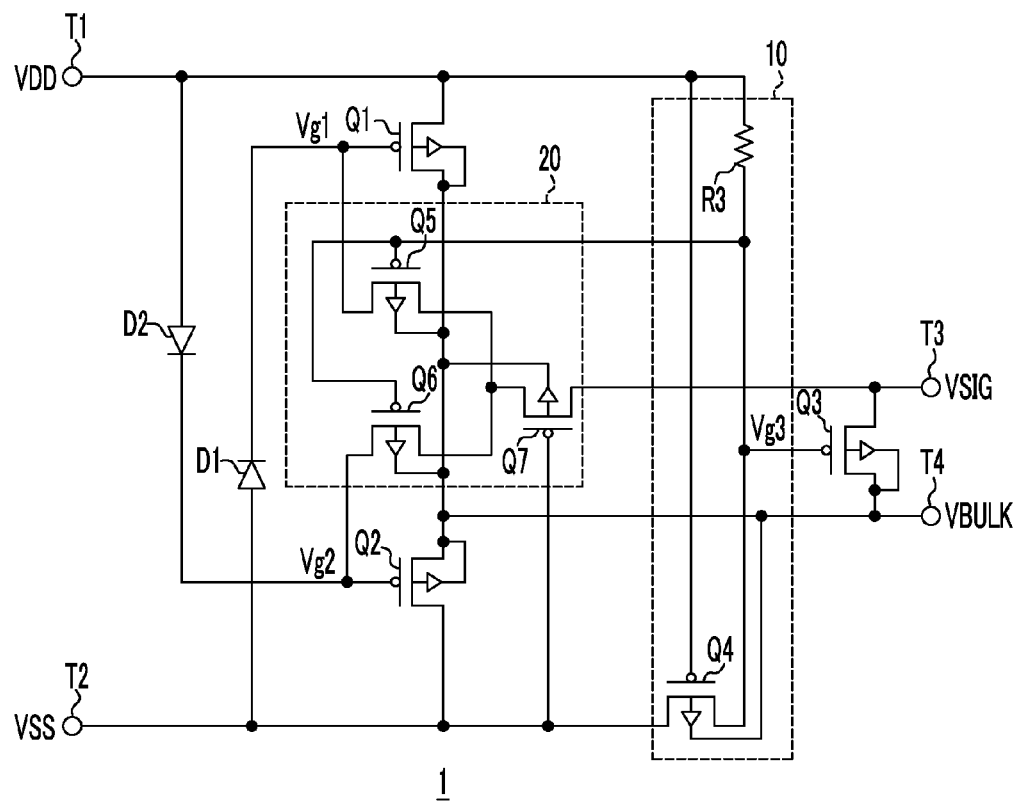
FIG. 13 is a diagram showing an example of the configuration of a voltage selection circuit according to a fifth embodiment.

FIG. 13 is a diagram showing an example of the configuration of a voltage selection circuit 1 according to a fifth embodiment. The voltage selection circuit 1 shown in FIG. 13 is formed by replacing the resistors R1 and R2 in the voltage selection circuit 1 shown in FIG. 1 with diodes D1 and D2. Other configurations of the voltage selection circuit 1 shown in FIG. 13 are the same as the voltage selection circuit 1 shown in FIG. 1.

The anode of the diode D1 is connected to the terminal T2, and the cathode is connected to the gate of the MOS transistor Q1. The anode of the diode D2 is connected to the terminal T1, and the cathode is connected to the gate of the MOS transistor Q2. By providing the diodes D1 and D2, it is possible to prevent a current that flows from the terminal T3 to the terminals T1 and T2 through the switching circuit 20. That is, in the voltage selection circuit 1 shown in FIG. 1, when the switching circuit 20 is turned on when the signal voltage VSIG is higher than the power supply voltage VDD or the ground potential VSS, a current flows from the terminal T3 to the terminals T1 and T2 through the switching circuit 20 and the resistors R1 and R2. In the voltage selection circuit 1 according to the present embodiment, a current flowing from the terminal T3 to the terminals T1 and T2 can be prevented by replacing the resistors R1 and R2 with the diodes D1 and D2 as shown in FIG. 13. Therefore, it is possible to increase the impedance of the terminal T3.

Figure 14:
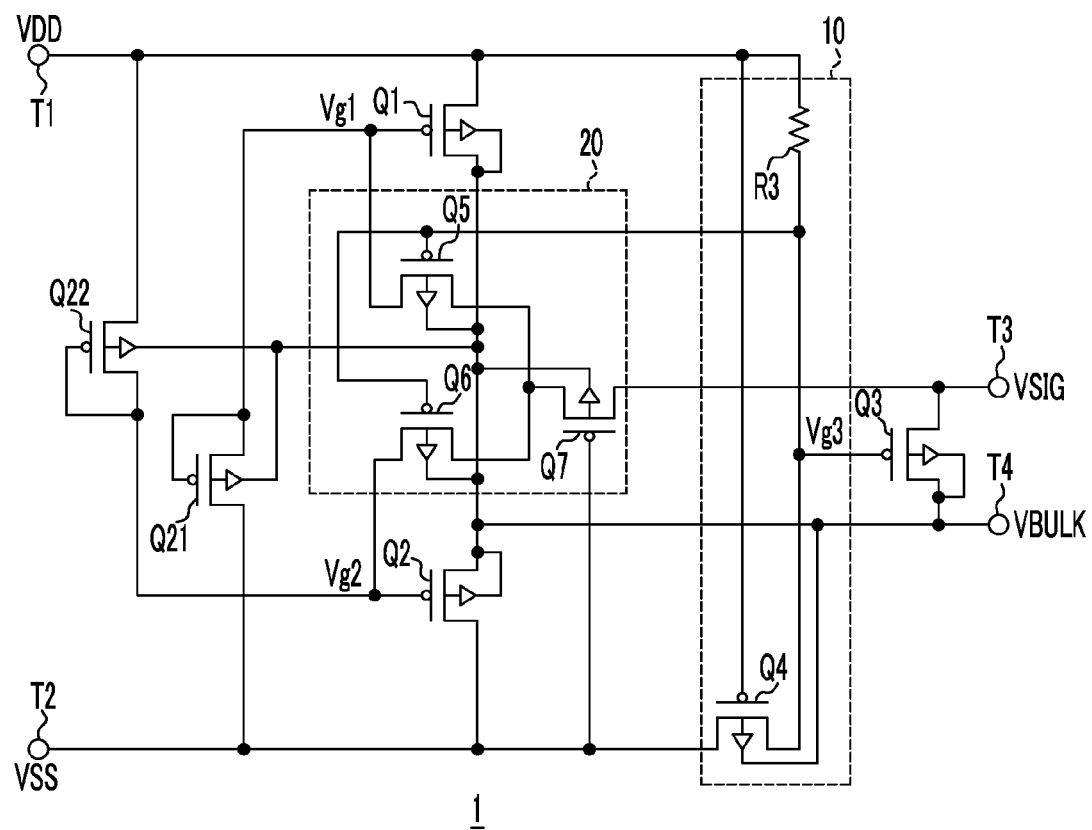
FIG. 14 is a diagram showing another configuration example of the voltage selection circuit according to the fifth embodiment.

For example, as shown in FIG. 14, each of the diodes D1 and D2 can also be replaced with a diode-connected MOS transistor. In the example shown in FIG. 14, P-type MOS transistors Q21 and Q22 are provided instead of the diodes D1 and D2. The source of the MOS transistor Q21 is connected to the terminal T2, and the drain and the gate are connected to the gate of the MOS transistor Q1. The source of the MOS transistor Q22 is connected to the terminal T1, and the drain and the gate of the MOS transistor Q22 are connected to the gate of the MOS transistor Q2. Since the MOS transistors Q21 and Q22 are turned off when the electric potential of the drain and the gate is higher than that of the source, it is possible to prevent a current that flows from the terminal T3 to the terminals T1 and T2 through the switching circuit 20.

Sixth Embodiment

Next, a sixth embodiment of the present invention will be described.

Figure 15:
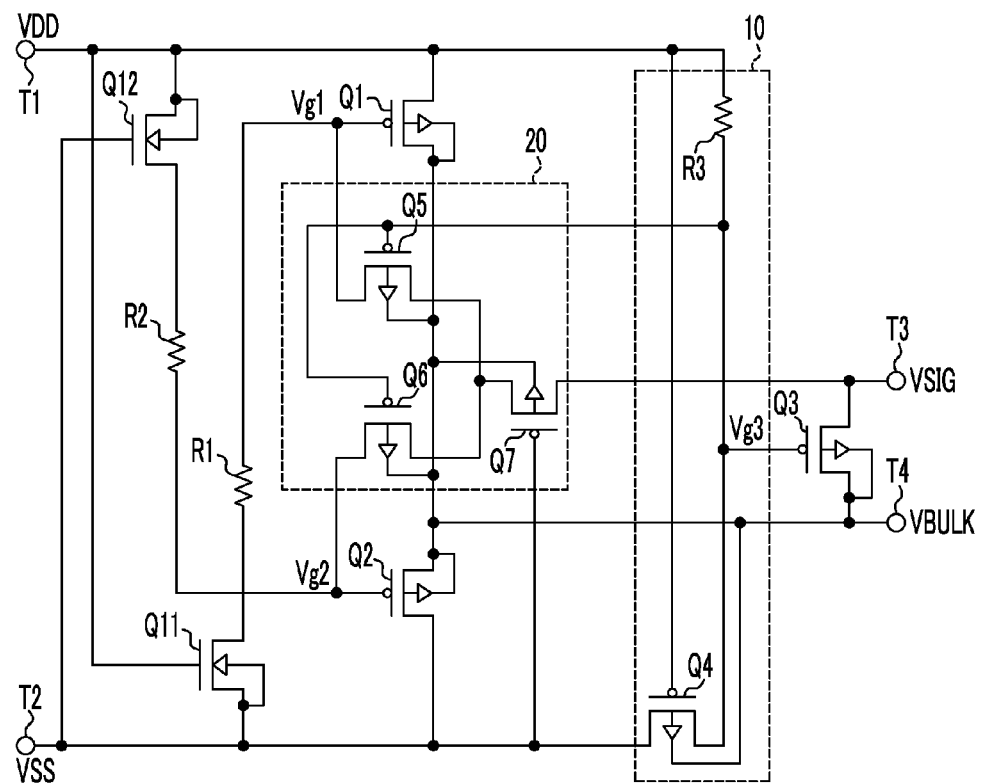
FIG. 15 is a diagram showing an example of the configuration of a voltage selection circuit according to a sixth embodiment.

FIG. 15 is a diagram showing an example of the configuration of a voltage selection circuit 1 according to the sixth embodiment. The voltage selection circuit 1 shown in FIG. 15 has the same configuration as in FIG. 1, and includes N-type MOS transistors Q11 and Q12.

The MOS transistor Q11 is an example of an eleventh MOS transistor in the present invention. The MOS transistor Q12 is an example of a twelfth MOS transistor in the present invention.

The MOS transistor Q11 is provided in a path connecting the resistor R1 and the terminal T2 to each other, and the gate of the MOS transistor Q11 is connected to the terminal T1 and the bulk is connected to the terminal T2. The MOS transistor Q12 is provided in a path connecting the resistor R2 and the terminal T2 to each other, and the gate of the MOS transistor Q12 is connected to the terminal T2 and the bulk is connected to the terminal T1.

When the power supply voltage VDD is the highest voltage, the power supply voltage VDD is higher than the ground potential VSS. Accordingly, the MOS transistor Q11 is turned on and the MOS transistor Q12 is turned off. In this case, the ground potential VSS is input to the gate of the MOS transistor Q1 through the resistor R1 and the channel of the MOS transistor Q11, and the power supply voltage VDD is input to the gate of the MOS transistor Q2 through the resistor R2 and the parasitic diode of the MOS transistor Q12. Accordingly, the MOS transistor Q1 is turned on, and the MOS transistor Q2 is turned off. Thus, the same operation as the voltage selection circuit 1 shown in FIG. 1 is realized.

When the ground potential VSS is the highest voltage, the ground potential VSS is higher than the power supply voltage VDD. Accordingly, the MOS transistor Q11 is turned off and the MOS transistor Q12 is turned on. In this case, the ground potential VSS is input to the gate of the MOS transistor Q1 through the resistor R1 and the parasitic diode of the MOS transistor Q11, and the power supply voltage VDD is input to the gate of the MOS transistor Q2 through the resistor R2 and the channel of the MOS transistor Q12. Accordingly, the MOS transistor Q1 is turned off, and the MOS transistor Q2 is turned on. Also in this case, the same operation as the voltage selection circuit 1 shown in FIG. 1 is realized.

When the signal voltage VSIG is the highest voltage, the MOS transistor Q12 is turned off if the power supply voltage VDD is higher than the ground potential VSS. Therefore, it is possible to prevent a current that flows from the terminal T3 to the terminal T1 through the switching circuit 20 and the resistor R2. On the contrary, if the ground potential VSS is higher than the power supply voltage VDD, the MOS transistor Q11 is turned off. Therefore, it is possible to prevent a current that flows from the terminal T3 to the terminal T2 through the switching circuit 20 and the resistor R1. In addition, when a voltage difference between the power supply voltage VDD and the ground potential VSS is smaller than the threshold voltage of the MOS transistors Q11 and Q12, both of the MOS transistors Q11 and Q12 are turned off. Therefore, it is possible to prevent both of a current that flows from the terminal T3 to the terminal T1 and a current that flows from the terminal T3 to the terminal T2.

Thus, according to the voltage selection circuit 1 of the present embodiment, it is possible to prevent at least a part of the current that flows from the terminal T3 to the terminals T1 and T2 when the signal voltage VSIG is the highest voltage. Therefore, it is possible to increase the impedance of the terminal T3.

Seventh Embodiment

Next, a seventh embodiment of the present invention will be described.

Figure 16:
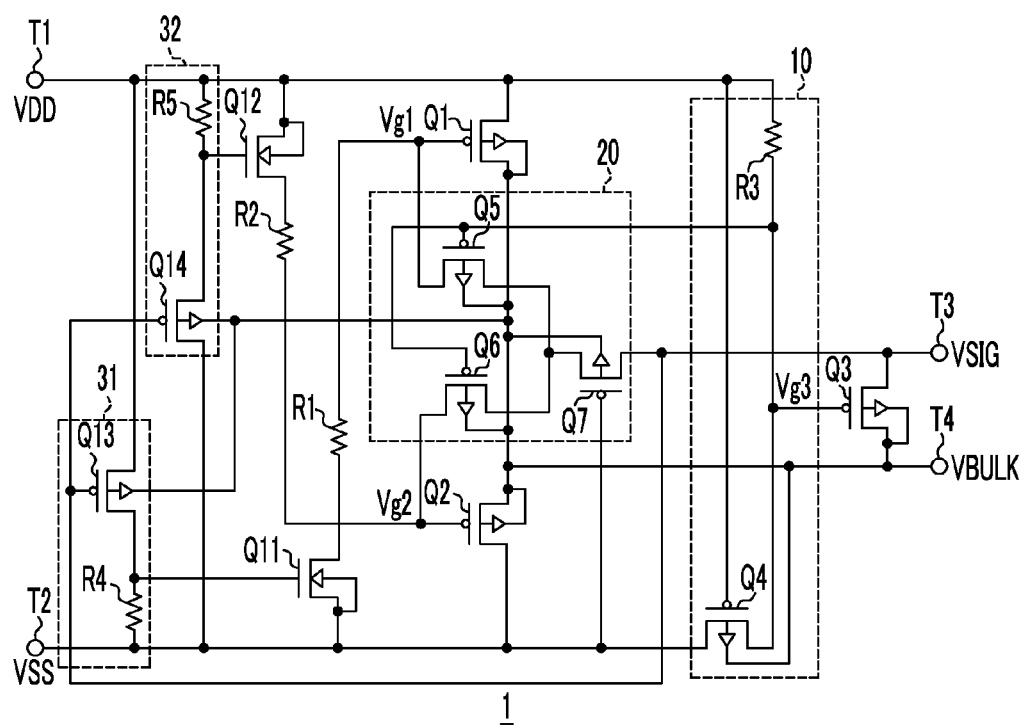
FIG. 16 is a diagram showing an example of the configuration of a voltage selection circuit according to a seventh embodiment.

FIG. 16 is a diagram showing an example of the configuration of the voltage selection circuit 1 according to the seventh embodiment. The voltage selection circuit 1 shown in FIG. 16 has the same configuration as the voltage selection circuit 1 shown in FIG. 1, and includes gate voltage control circuits 31 and 32. The gate voltage control circuit 31 includes a P-type MOS transistor Q13 and a resistor R4. The gate voltage control circuit 32 includes a P-type MOS transistor Q14 and a resistor R5.

The gate voltage control circuit 31 is an example of a first gate voltage control circuit in the present invention.

The MOS transistor Q13 is an example of a thirteenth MOS transistor in the present invention.

The resistor R4 is an example of a fourth resistor in the present invention.

The gate voltage control circuit 32 is an example of a second gate voltage control circuit in the present invention.

The MOS transistor Q14 is an example of a fourteenth MOS transistor in the present invention.

The resistor R5 is an example of a fifth resistor in the present invention.

The MOS transistor Q13 is provided in a path connecting the gate of the MOS transistor Q11 and the terminal T1 to each other, and the gate of the MOS transistor Q13 is connected to the terminal T3 and the bulk is connected to the terminal T4. The resistor R4 is connected between the gate of the MOS transistor Q11 and the terminal T2.

The MOS transistor Q14 is provided in a path connecting the gate of the MOS transistor Q12 and the terminal T2 to each other, and the gate of the MOS transistor Q14 is connected to the terminal T3 and the bulk is connected to the terminal T4. The resistor R5 is connected between the gate of the MOS transistor Q12 and the terminal T1.

When the signal voltage VSIG is the highest voltage, the highest voltage is input to the gates of the MOS transistors Q13 and Q14. Accordingly, the MOS transistors Q13 and Q14 are turned off. In this case, since no current flows through the resistor R4, the electric potentials of the gate and the source of the MOS transistor Q11 become almost equal. Accordingly, the MOS transistor Q11 is turned off. In addition, since no current flows through the resistor R5, the electric potentials of the gate and the source of the MOS transistor Q12 become almost equal. Accordingly, the MOS transistor Q12 is also turned off. Therefore, when the signal voltage VSIG is the highest voltage, a current flowing from the terminal T3 to the terminals T1 and T2 through the switching circuit 20 and the resistors R1 and R2 can be prevented by the MOS transistors Q11 and Q12 in the OFF state.

When the power supply voltage VDD is the highest voltage, if the voltage difference between the power supply voltage VDD and the signal voltage VSIG is sufficiently larger than the threshold voltage of the MOS transistors Q13 and Q14, the MOS transistor Q13 operates in a linear region and the MOS transistor Q14 operates in a linear region or in a saturation region.

When the MOS transistor Q13 operates in the linear region, the highest voltage VDD is input to the gate of the MOS transistor Q11 through the MOS transistor Q13. Accordingly, the MOS transistor Q11 is turned on. When the MOS transistor Q11 is turned on, the ground potential VSS is input to the gate of the MOS transistor Q1 through the resistor R1. Accordingly, the MOS transistor Q1 is turned on.

In addition, when the MOS transistor Q14 operates in the linear region or in the saturation region, the electric potential of the gate of the MOS transistor Q12 is lower than that of the source of the MOS transistor Q12. Accordingly, the MOS transistor Q12 is turned off. In this case, since the highest voltage VDD is input to the gate of the MOS transistor Q2 through the parasitic diode of the MOS transistor Q12 and the resistor R2, the MOS transistor Q2 is turned off.

Therefore, when the power supply voltage VDD is the highest voltage, the MOS transistor Q1 is turned on and the MOS transistor Q2 is turned off. As a result, the same operation as the voltage selection circuit 1 shown in FIG. 1 is realized.

When the ground potential VSS is the highest voltage, if the voltage difference between the ground potential VSS and the signal voltage VSIG is sufficiently larger than the threshold voltage of the MOS transistors Q13 and Q14, the MOS transistor Q13 operates in a linear region or in a saturation region and the MOS transistor Q14 operates in a linear region.

When the MOS transistor Q13 operates in the linear region or in the saturation region, the electric potential of the gate of the MOS transistor Q11 is lower than that of the source of the MOS transistor Q11. Accordingly, the MOS transistor Q11 is turned off. In this case, since the highest voltage VSS is input to the gate of the MOS transistor Q1 through the parasitic diode of the MOS transistor Q11 and the resistor R1, the MOS transistor Q1 is turned off.

When the MOS transistor Q14 operates in the linear region, the highest voltage VSS is input to the gate of the MOS transistor Q12 through the MOS transistor Q14. Accordingly, the MOS transistor Q12 is turned on. When the MOS transistor Q12 is turned on, the power supply voltage VDD is input to the gate of the MOS transistor Q2 through the resistor R2. Accordingly, the MOS transistor Q2 is turned on.

Therefore, when the ground potential VSS is the highest voltage, the MOS transistor Q1 is turned off and the MOS transistor Q2 is turned on. As a result, the same operation as the voltage selection circuit 1 shown in FIG. 1 is realized.

As described above, according to the voltage selection circuit 1 of the present embodiment, when the signal voltage VSIG is the highest voltage, each gate voltage is controlled so that the MOS transistors Q11 and Q12 are turned off. As a result, since it is possible to prevent a current that flows from the terminal T3 to the terminals T1 and T2 through the switching circuit 20 and the resistors R1 and R2, it is possible to increase the impedance of the terminal T3.

Eighth Embodiment

Next, an eighth embodiment of the present invention will be described.

The present embodiment relates to a semiconductor integrated circuit device capable of preventing overcurrent due to incorrect connection or the like by using the voltage selection circuit 1 according to each of the embodiments described above.

Figure 17:
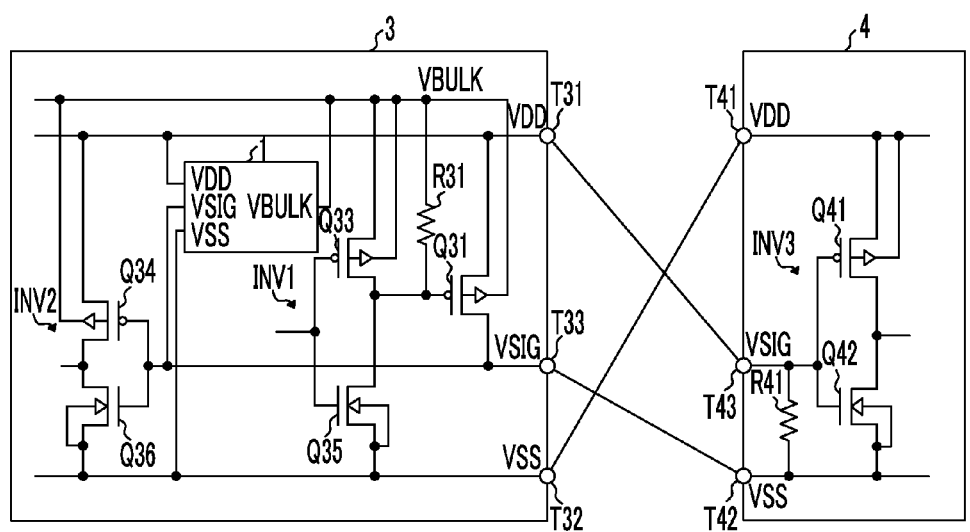
FIG. 17 is a diagram showing an example of the configuration of a semiconductor integrated circuit device according to an eighth embodiment.

FIG. 17 is a diagram showing an example of the configuration of a semiconductor integrated circuit device 3 according to the eighth embodiment. The semiconductor integrated circuit device 3 shown in FIG. 17 includes a terminal T31 connected to the power supply line of the power supply voltage VDD, a terminal T32 connected to the power supply line of the ground potential VSS, and a terminal T33 connected to a signal line. Although the terminals T31 to T33 should be correctly connected to corresponding terminals T41 to T43 of an external device 4, the terminals T31 to T33 are connected to the wrong terminals in the example shown in FIG. 17.

The semiconductor integrated circuit device 3 includes the voltage selection circuit 1 according to the embodiment described above in order to prevent an overcurrent from flowing to the inside of the circuit even in the case of incorrect connection shown in FIG. 17. The power supply voltage VDD is input to the terminal T1 of the voltage selection circuit 1, the signal voltage VSIG is input to the terminal T3, and the ground potential VSS is input to the terminal T2. The selection voltage VBULK output from the voltage selection circuit 1 is applied to the bulks of the P-type MOS transistors Q31, Q33, and Q34 that form a circuit. Accordingly, regardless of a voltage applied at the terminals T31 to T33, the bulks of the P-type MOS transistors always have the highest electric potential. For this reason, it is possible to reliably prevent an overcurrent from flowing through a parasitic diode that is present between the channel terminal and the bulk of each P-type MOS transistor.

In the example shown in FIG. 17, the output circuit (P-type MOS transistor Q31) of the terminal T33 connected to the signal line is an open drain type circuit, and does not have a transistor for driving the terminal T33 to the low level. Instead, in the device 4 on a signal input side, an input resistor R41 is provided between the terminal T43 and the terminal T42 so that the input signal level can be reduced to the low level when the MOS transistor Q31 is OFF. When the input resistor R41 is not provided in the device 4 on the signal input side, an external NPN-type transistor Q37 may be provided, for example, as shown in FIG. 18.

Figure 18:
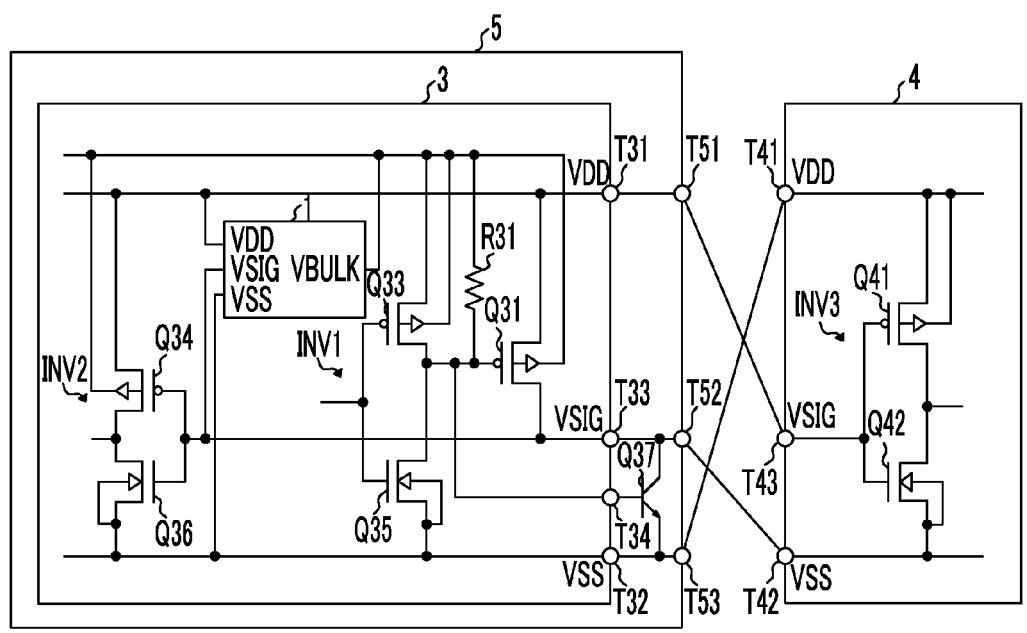
FIG. 18 is a diagram showing another configuration example of the semiconductor integrated circuit device according to the eighth embodiment.

In the example shown in FIG. 18, the semiconductor integrated circuit device 3 is mounted on a circuit board 5, and the terminals T31, T32, and T33 of the semiconductor integrated circuit device 3 are connected to terminals T51, T52, and T53 of the circuit board 5, respectively. The terminals T51, T52, and T53 are connected to the terminals T41 to T43 of the external device 4 through a cable harness or the like. Although the terminals T51 to T53 should be correctly connected to the corresponding terminals T41 to T43 of the external device 4, the terminals T51 to T53 are connected to the wrong terminals in the example shown in FIG. 18. The collector of the external NPN-type transistor Q37 is connected to the terminal 33, the emitter is connected to the terminal T32, and the base is connected to the terminal T34. The terminal T34 is connected to the gate of the MOS transistor Q31 of the semiconductor integrated circuit device 3, and a high-level signal or a low-level signal is supplied from an inverter circuit INV1 (Q33, Q34). When the output of the inverter circuit INV1 is at a high level, the MOS transistor Q31 is turned off and the NPN-type transistor Q37 is turned on. Accordingly, even if the input resistor R41 is not provided, the voltage of the terminal T33 is at a low level.

If the N-type MOS transistor inside the semiconductor integrated circuit device 3 is used as a transistor for driving the terminal T33 to the low level, when a voltage lower than the ground potential VSS is applied to the terminal T33, a current flows from the terminal T32 to the terminal T33 through a parasitic diode of the bulk of the N-type MOS transistor. In the circuit shown in FIG. 18, the external NPN-type transistor Q37 is used as a transistor for driving the terminal T33 to the low level. Therefore, even if a voltage lower than the ground potential VSS is applied to the terminal T33, no overcurrent flows to the inside of the semiconductor integrated circuit device 3.

While several embodiments of the present invention have been described above, the present invention is not limited only to the embodiments described above, and includes various variations.

Figure 19:
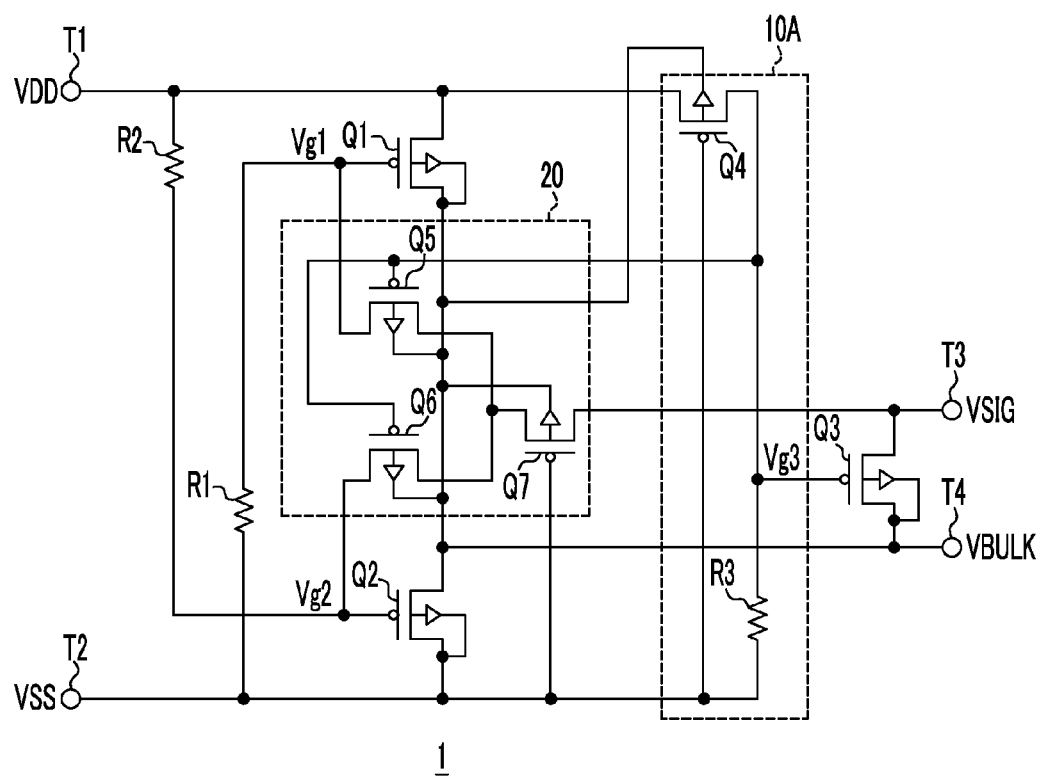
FIG. 19 is a diagram showing a modification example of the semiconductor integrated circuit device.

For example, in the voltage output circuit 10 of the voltage selection circuit 1 shown in FIGS. 1 and 10 to 16, the resistor R3 is connected to the terminal T1 and the MOS transistor Q4 is connected to the terminal T2. However, the present invention is not limited to this example. In another embodiment of the present invention, as shown in FIG. 19, the resistor R3 may be connected to the terminal T2, and the MOS transistor Q4 may be connected to the terminal T1. That is, the order of connecting the resistor R3 and the MOS transistor Q4 in series between the terminal T1 and the terminal T2 is arbitrary. In this case, the gate of the MOS transistor Q4 is connected to one terminal of the resistor R3 connected to the terminal T1 or the terminal T2. Also in a voltage output circuit 10A shown in FIG. 19, similar to the voltage output circuit 10 shown in FIG. 1 and the like, the higher voltage of the power supply voltage VDD and the ground potential VSS is output as the voltage Vg3 from the connection node between the resistor R3 and the MOS transistor Q4.

Although the gate of the MOS transistor Q7 (Q7-1, Q7-2) is connected to the terminal T2 in the voltage selection circuit 1 shown in FIGS. 1, 10, and 13 to 16, the gate may be connected to the terminal T1 in another embodiment of the present invention.

In addition, although the gates of the MOS transistors Q8 and Q9 are connected to the terminal T2 in the voltage selection circuit 1 shown in FIGS. 11 and 12, the gate may be connected to the terminal T1 in another embodiment of the present invention.

In the voltage selection circuit 1 according to the fifth embodiment shown in FIGS. 13 and 14, the example has been mentioned in which the resistors R1 and R2 in the voltage selection circuit 1 shown in FIG. 1 are replaced with diodes or MOS transistors. However, the present invention is not limited thereto. That is, in the voltage selection circuit 1 according to other embodiments (FIGS. 10 to 12, 15, and 16), the resistors R1 and R2 can also be replaced with diodes or MOS transistors. In addition, a diode or a MOS transistor may be provided in series with the resistors R1 and R2.

In the embodiment described above, a place where the gate of a MOS transistor is directly connected to a node (for example, an input terminal or an output terminal) on another circuit is present. However, the present invention is not limited thereto. In another embodiment of the present invention, an element, such as a resistor, may be inserted between the gate of a MOS transistor and the node on a circuit in consideration of the influence of electrostatic discharge (ESD) and the like.

Although the example of the voltage selection circuit 1 that outputs the highest voltage of the three input voltages VDD, VSS, and VSIG as the selection voltage VBULK has been mentioned in the embodiment described above, the present invention is not limited thereto. That is, in another embodiment of the present invention, for example, as shown in FIG. 20, a voltage selection circuit 2 may be configured to output the lowest voltage of the three input voltages VDD, VSS, and VSIG as the selection voltage VBULK.

Figure 20:
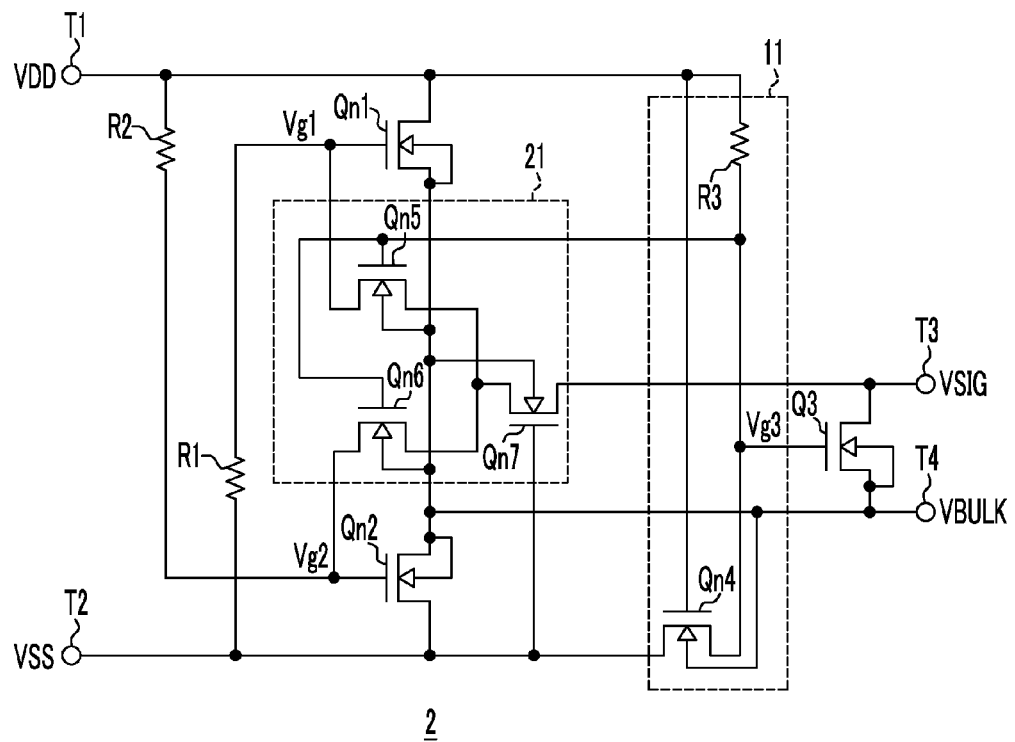
FIG. 20 is a diagram showing a modification example of the semiconductor integrated circuit device.

The voltage selection circuit 2 shown in FIG. 20 is formed by replacing the P-type MOS transistors Q1 to Q7 in the voltage selection circuit 1 shown in FIG. 1 with N-type MOS transistors Qn1 to Qn7. That is, the voltage selection circuit 2 shown in FIG. 20 includes a terminal T1 to which the power supply voltage VDD is input, a terminal T2 to which the ground potential VSS is input, a terminal T3 to which the signal voltage VSIG is input, a terminal T4 from which the selection voltage VBULK is output, N-type MOS transistors Qn1, Qn2, and Qn3, resistors R1 and R2, a voltage output circuit 11, and a switching circuit 21. The voltage output circuit 11 includes an N-type MOS transistor Qn4 and a resistor R3. The switching circuit 21 includes N-type MOS transistors Qn5, Qn6, and Qn7.

The voltage output circuit 11 outputs the lower one of the power supply voltage VDD and the ground potential VSS, as the voltage Vg3, to the gate of the MOS transistor Qn3.

The switching circuit 21 connects the terminal T3 to the gate of each of the MOS transistors Qn1 and Qn2 when the signal voltage VSIG is lower than the voltage Vg3 of the voltage output circuit 11, and disconnects the terminal T3 from the gate of each of the MOS transistors Qn1 and Qn2 when the signal voltage VSIG is higher than the voltage Vg3 of the voltage output circuit 10.

Figure 21:
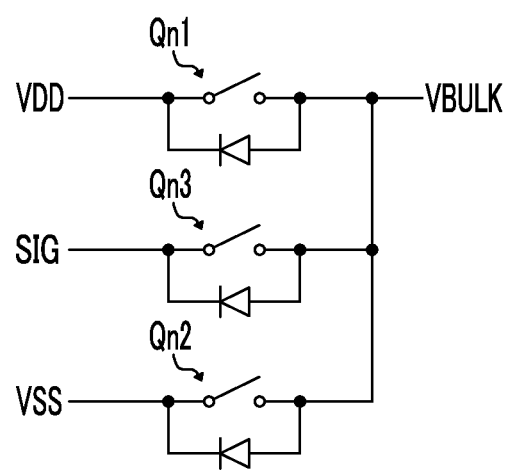
FIG. 21 is a diagram showing an equivalent circuit of the main part of the voltage selection circuit shown in FIG. 20.
Figure 22:
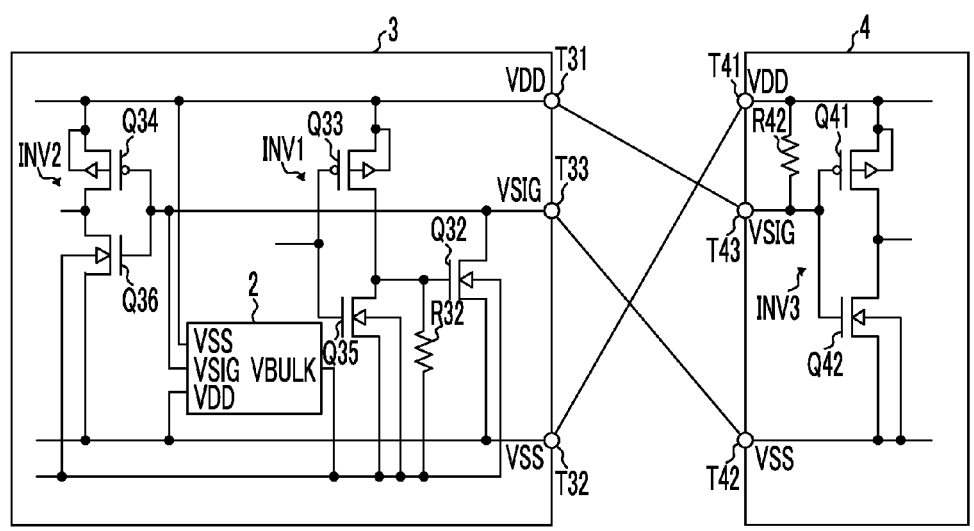
FIG. 22 is a diagram showing an example of the configuration of a semiconductor integrated circuit device using the voltage selection circuit shown in FIG. 20.

FIG. 21 is a diagram showing an equivalent circuit of the main part of the voltage selection circuit 2 shown in FIG. 20. FIG. 22 is a diagram showing an example of the configuration of the semiconductor integrated circuit device 3 using the voltage selection circuit 2 shown in FIG. 20. In the semiconductor integrated circuit device 3 shown in FIG. 20, the power supply voltage VDD is input to the terminal T1 of the voltage selection circuit 2, the signal voltage VSIG is input to the terminal T2, and the ground potential VSS is input to the terminal T3. The selection voltage VBULK output from the voltage selection circuit 2 is applied to the bulks of the N-type MOS transistors Q32, Q35, and Q36 that form a circuit. Accordingly, even if any voltage is applied at the terminals T31 to T33, the bulks of the N-type MOS transistors always have the lowest electric potential. For this reason, it is possible to reliably prevent an overcurrent from flowing through a parasitic diode that is present between the channel terminal and the bulk of each N-type MOS transistor.

It should be understood by those skilled in the art that various modifications, combinations, sub-combinations and alterations may occur depending on design requirements and other factors insofar as they are within the scope of the appended claims or the equivalents thereof.

What is claimed is:

1. A voltage selection circuit that selects a highest voltage of a plurality of voltages, comprising:
   a first terminal to which a first voltage is input;
   a second terminal to which a second voltage is input;
   a third terminal to which a third voltage is input;

a fourth terminal from which a highest voltage among the first voltage, the second voltage, and the third voltage is output;
a first MOS transistor connected between the first and fourth terminals;
a second MOS transistor connected between the second and fourth terminals;
a third MOS transistor connected between the third and fourth terminals;
a first resistor connected between a gate of the first MOS transistor and the second terminal;
a second resistor connected between a gate of the second MOS transistor and the first terminal;
a voltage output circuit that outputs an output voltage which is a higher voltage of the first and second voltages to a gate of the third MOS transistor; and
a switching circuit that connects the third terminal to the respective gates of the first and second MOS transistors when the third voltage is higher than the output voltage of the voltage output circuit,
wherein the first MOS transistor, the second MOS transistor, the third MOS transistor, and MOS transistors included in the voltage output circuit and the switching circuit are of P-type and have respective bulks connected to the fourth terminal.

2. The voltage selection circuit according to claim 1, wherein
the voltage output circuit includes a fourth MOS transistor and a third resistor connected in series between the first and second terminals,
a gate of the fourth MOS transistor is connected to one terminal of the third resistor connected to the first terminal or the second terminal, and
a higher voltage of the first and second voltages is output at a connection node between the fourth MOS transistor and the third resistor.

3. The voltage selection circuit according to claim 1, wherein the switching circuit includes:
a fifth MOS transistor provided in a path connecting the gate of the first MOS transistor and the third terminal, the fifth MOS transistor having a gate to which the output voltage of the voltage output circuit is applied; and
a sixth MOS transistor provided in a path connecting the gate of the second MOS transistor and the third terminal, the sixth MOS transistor having a gate to which the output voltage of the voltage output circuit is applied.

4. The voltage selection circuit according to claim 3, wherein the switching circuit further includes at least one seventh MOS transistor provided in a path connecting the gate of the first MOS transistor to the third terminal and a path connecting the gate of the second MOS transistor to the third terminal, the seventh MOS transistor having a gate connected to the first terminal or the second terminal.

5. The voltage selection circuit according to claim 1, wherein the switching circuit includes:
a eighth MOS transistor provided in a path connecting the gate of the first MOS transistor and the third terminal, the eighth MOS transistor having a gate connected to the first terminal or the second terminal;
a ninth MOS transistor provided in a path connecting the gate of the second MOS transistor and the third terminal, the ninth MOS transistor having a gate connected to the first terminal or the second terminal; and
at least one tenth MOS transistor provided in a path connecting the gate of the first MOS transistor to the third terminal through the eighth MOS transistor and a path connecting the gate of the second MOS transistor to the third terminal through the ninth MOS transistor, the tenth MOS transistor having a gate to which the output voltage of the voltage output circuit is applied.

6. The voltage selection circuit according to claim 1,
wherein at least one of the first and second resistors is replaced with a diode or a MOS transistor for preventing a current that flows through the switching circuit from the third terminal, or
wherein the diode or the MOS transistor is provided in series with at least one of the first and second resistors.

7. The voltage selection circuit according to claim 1, further comprising:
at least one of an eleventh MOS transistor of N-type and a twelfth MOS transistor of N-type,
wherein the eleventh MOS transistor is provided in a path connecting the first resistor and the second terminal, the eleventh MOS transistor having a gate connected to the first terminal and a bulk connected to the second terminal, and the twelfth MOS transistor is provided in a path connecting the second resistor and the first terminal, the twelfth MOS transistor having a gate connected to the second terminal and a bulk connected to the first terminal.

8. The voltage selection circuit according to claim 7, further comprising:
at least one of a first gate voltage control circuit and a second gate voltage control circuit, wherein the first gate voltage control circuit includes:
a thirteenth MOS transistor of P-type provided in a path connecting the gate of the eleventh MOS transistor and the first terminal, the thirteenth MOS transistor having a gate connected to the third terminal and a bulk connected to the fourth terminal; and
a fourth resistor connected between the gate of the eleventh MOS transistor and the second terminal,
and wherein the second gate voltage control circuit includes:
a fourteenth MOS transistor of P-type provided in a path connecting the gate of the twelfth MOS transistor and the second terminal, the fourteenth MOS transistor having a gate connected to the third terminal and a bulk connected to the fourth terminal; and
a fifth resistor connected between the gate of the twelfth MOS transistor and the first terminal.

9. A voltage selection circuit that selects a lowest voltage of a plurality of voltages, comprising:
a first terminal to which a first voltage is input;
a second terminal to which a second voltage is input;
a third terminal to which a third voltage is input;
a fourth terminal from which a lowest voltage among the first voltage, the second voltage, and the third voltage is output;
a first MOS transistor connected between the first and fourth terminals;
a second MOS transistor connected between the second and fourth terminals;
a third MOS transistor connected between the third and fourth terminals;
a first resistor connected between a gate of the first MOS transistor and the second terminal;
a second resistor connected between a gate of the second MOS transistor and the first terminal;
a voltage output circuit that outputs an output voltage which is a lower voltage of the first and second voltages to a gate of the third MOS transistor; and a switching circuit that connects the third terminal to the respective gates of the first and second MOS transistors when the third voltage is lower than the output voltage of the voltage output circuit, wherein the first MOS transistor, the second MOS transistor, the third MOS transistor, and MOS transistors included in the voltage output circuit and the switching circuit are of N-type and have respective bulks connected to the fourth terminal.

10. A semiconductor integrated circuit device, comprising:
the voltage selection circuit according to claim 1, wherein
the first voltage is a power supply voltage,
the second voltage is a ground potential, and
a signal is output or input at the third terminal; and
a plurality of MOS transistors of P-type which form a circuit, at least some of the MOS transistors having respective bulks connected to the fourth terminal of the voltage selection circuit.

11. A semiconductor integrated circuit device, comprising:
the voltage selection circuit according to claim 9, wherein
the first voltage is a power supply voltage,
the second voltage is a ground potential, and
a signal is output or input at the third terminal; and
a plurality of MOS transistors of N-type which form a circuit, at least some of the MOS transistors having respective bulks connected to the fourth terminal of the voltage selection circuit.

\* \* \* \* \*